US012701823B2

(12) United States Patent
Park et al.

(10) Patent No.: US 12,701,823 B2
(45) Date of Patent: Aug. 4, 2026

(54) LIGHT EMITTING ELEMENT AND METHOD OF FABRICATING LIGHT EMITTING ELEMENT

(71) Applicant: Samsung Display Co., LTD., Yongin-si (KR)

(72) Inventors: Hoo Keun Park, Yongin-si (KR); Jin Wan Kim, Yongin-si (KR); Seung Geun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 692 days.

(21) Appl. No.: 18/081,985

(22) Filed: Dec. 15, 2022

(65) Prior Publication Data

US 2023/0197888 A1 Jun. 22, 2023

(30) Foreign Application Priority Data

Dec. 16, 2021 (KR) ........................ 10-2021-0180905

(51) Int. Cl.
| | |
|---|---|
| *H01L 33/04* | (2010.01) |
| *H10H 20/01* | (2025.01) |
| *H10H 20/811* | (2025.01) |
| *H10H 20/831* | (2025.01) |
| *H10P 50/00* | (2026.01) |
| *B82Y 40/00* | (2011.01) |

(52) U.S. Cl.
CPC ...... *H10H 20/811* (2025.01); *H10H 20/0137* (2025.01); *H10H 20/831* (2025.01); *H10P 50/73* (2026.01); *B82Y 40/00* (2013.01)

(58) Field of Classification Search
CPC ............. H10H 20/811; H10H 20/0137; H10H 20/831; H10H 20/84; H10H 20/812; H10H 20/01335; H10H 20/819; H10H 20/018; H10H 20/817; H01L 21/31144; B82Y 40/00

See application file for complete search history.

(56) References Cited

U.S. PATENT DOCUMENTS

| | | | |
|---|---|---|---|
| 9,112,112 B2 | 8/2015 | Do et al. | |
| 9,773,761 B2 | 9/2017 | Do | |

(Continued)

FOREIGN PATENT DOCUMENTS

| | | |
|---|---|---|
| CN | 112736165 | 4/2021 |
| KR | 10-0661960 | 12/2006 |

(Continued)

OTHER PUBLICATIONS

International Search Report for International Application No. PCT/KR2022/020454, dated Mar. 20, 2023.

(Continued)

*Primary Examiner* — Mohammed R Alam
(74) *Attorney, Agent, or Firm* — Womble Bond Dickinson (US) LLP

(57) ABSTRACT

Provided herein is a light emitting element and a method of fabricating the light emitting element. The light emitting element includes a first semiconductor layer, a first insulating film disposed on the first semiconductor layer, the first insulating film including a nano-pattern, an active layer disposed in the nano-pattern of the first insulating film, and a second semiconductor layer disposed on the active layer in the nano-pattern of the first insulating film.

18 Claims, 19 Drawing Sheets

(56) References Cited

U.S. PATENT DOCUMENTS

| | | | |
|---|---|---|---|
| 2014/0145237 A1* | 5/2014 | Do | H10H 20/813 |
| | | | 438/34 |
| 2015/0207038 A1* | 7/2015 | Hwang | H10H 20/841 |
| | | | 257/88 |
| 2016/0172339 A1* | 6/2016 | Do | H05K 1/0295 |
| | | | 257/89 |
| 2021/0126157 A1 | 4/2021 | Dupre et al. | |
| 2021/0167050 A1 | 6/2021 | Cho et al. | |
| 2021/0202450 A1 | 7/2021 | Min et al. | |
| 2022/0173277 A1 | 6/2022 | Lee et al. | |
| 2022/0336527 A1 | 10/2022 | Cha et al. | |

FOREIGN PATENT DOCUMENTS

| | | |
|---|---|---|
| KR | 10-1008268 | 1/2011 |
| KR | 10-2011-0117963 | 10/2011 |
| KR | 10-1244926 | 3/2013 |
| KR | 10-1490758 | 2/2015 |
| KR | 10-2015-0021613 | 3/2015 |
| KR | 10-2020-0029100 | 3/2020 |
| KR | 10-2021-0031588 | 3/2021 |
| KR | 10-2022-0078016 | 6/2022 |

OTHER PUBLICATIONS

Matthew S. Wong et al., "Improved performance of AlGaInP red micro-light diodes with sidewall treatments", Optics Express, Feb. 17, 2020, pp. 5787-5793, vol. 28, No. 4.

Jordan M. Smith at el., "Comparison of size-dependent characteristics of blue and green InGaN microLEDs down to 1 μm in diameter", Appl. Phys. Lett. 116, 071102, Feb. 19, 2020.

Ryan Ley at el., "Strain relaxation of InGaN/GaN multi-quantum well light emitters via nanopatterning", Optics Express, vol. 27, No. 21, Oct. 3, 2019.

Dae-Woo Jeon at el., "Enhanced optical output performance in InGaN/GaN light-emitting diode embedded with SiO2 nanoparticles", Optics Express, vol. 22, No. 18, DOI: 10.1364/OE.22.021454, Aug. 27, 2014.

Matthew S. Wong at el., "Size-independent peak efficiency of Ill-nitride micro-light-emitting-diodes using chemical treatment and sidewall passivation", Applied Physics Express 12, 097004, Aug. 21, 2019.

Qianqian Jiao at el., "The effects of nanocavity and photonic crystal in InGaN/GaN nanorod LED arrays", Nanoscale Research Letters, DOI 10.1186/s11671-016-1548-9, Jul. 20, 2016.

* cited by examiner

LIGHT EMITTING ELEMENT AND METHOD OF FABRICATING LIGHT EMITTING ELEMENT

CROSS-REFERENCE TO RELATED APPLICATION(S)

This application claims priority to and benefits of Korean patent application number 10-2021-0180905 under 35 U.S.C. § 119 filed on Dec. 16, 2021 in the Korean Intellectual Property Office, the entire contents of which are incorporated herein by reference.

BACKGROUND

1. Technical Field

Various embodiments are directed to a light emitting element and a method of fabricating the light emitting element.

2. Description of the Related Art

Recently, as interest in information display increases, research and development on display devices have been continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Various embodiments are directed to a light emitting element having improved efficiency and reliability, and a method of fabricating the light emitting element.

The objects of the disclosure are not limited to the above-stated objects, and those skilled in the art will clearly understand other objects from the description and the accompanying claims.

A light emitting element in accordance with an embodiment may include a first semiconductor layer; a first insulating film disposed on the first semiconductor layer, the first insulating film including a nano-pattern; an active layer disposed in the nano-pattern of the first insulating film; and a second semiconductor layer disposed on the active layer in the nano-pattern of the first insulating film.

A diameter of the nano-pattern of the first insulating film may be less than a diameter of the first semiconductor layer.

The nano-pattern of the first insulating film may expose the first semiconductor layer.

The first insulating film may cover the active layer and the second semiconductor layer.

The active layer may be disposed between the first semiconductor layer and the second semiconductor layer.

The light emitting element may further include a second insulating film disposed on the first insulating film.

The second insulating film may cover the first semiconductor layer that is exposed from the first insulating film.

The active layer may emit red light.

The light emitting element may further include an electrode layer disposed on the second semiconductor layer.

2

The light emitting element may further include a super-lattice layer disposed in the nano-pattern of the first insulating film.

A method of fabricating a light emitting element in accordance with an embodiment may include forming a first semiconductor layer on a stack substrate; forming a first insulating film on the first semiconductor layer; forming nano-patterns by etching the first insulating film; forming an active layer and a second semiconductor layer in the nano-patterns of the first insulating film, and partially etching the first insulating film and the first semiconductor layer, and forming light emitting patterns.

In the partially etching of the first insulating film and the first semiconductor layer, the active layer and the second semiconductor layer may be protected by the first insulating film.

The nano-patterns of the first insulating film may pass through the first insulating film and expose a top surface of the first semiconductor layer.

The method may further include forming an electrode layer on the second semiconductor layer.

The method may further include forming a mask on the electrode layer.

The mask may overlap the nano-patterns of the first insulating film in a plan view.

The forming of the light emitting patterns may include etching the electrode layer, the first insulating film, and the first semiconductor layer that are exposed from the mask.

The method may further include forming a second insulating film on the light emitting patterns.

The second insulating film may cover the first insulating film and the first semiconductor layer.

The method may further include separating the light emitting patterns from the stack substrate.

Details of various embodiments are included in the detailed descriptions and drawings.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figures 1, 2:
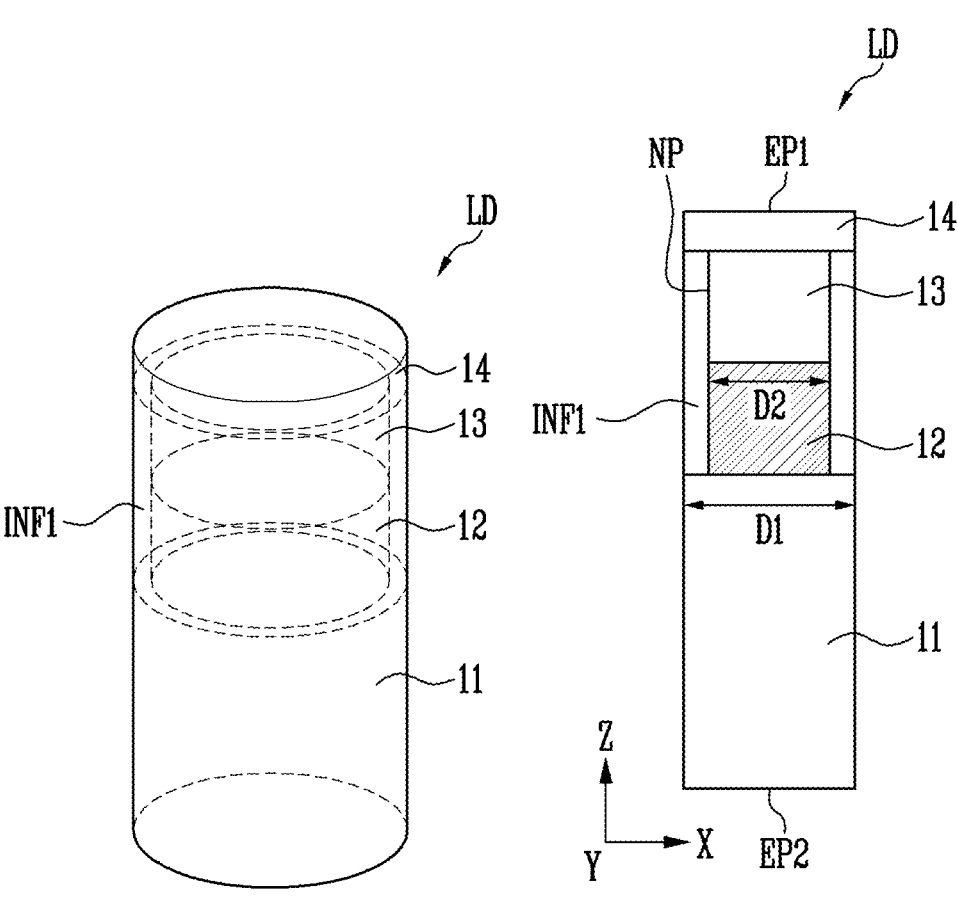
FIG. 1 is a schematic perspective view illustrating a light emitting element in accordance with an embodiment.
FIGS. 2 and 3 are schematic sectional views each illustrating a light emitting element in accordance with an embodiment.

Advantages and features of the disclosure, and methods for achieving the same will be understood with reference to embodiments described in detail together with the accompanying drawings. The disclosure is not limited to the following embodiments, and various modifications are possible. These embodiments are provided so that this disclosure will be thorough and complete and will fully convey the disclosure to those skilled in the art, and the disclosure will also be defined by the appended claims.

In the drawings, sizes, thicknesses, ratios, and dimensions of the elements may be exaggerated for ease of description and for clarity. Like numbers refer to like elements throughout.

The terminology used herein is for the purpose of describing embodiments only and is not intended to be limiting of embodiments. In this specification, the terms of a singular form may include plural forms unless indicated otherwise. For example, as used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be further understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

Furthermore, the term "coupling" or" connection" may comprehensively refer to physical and/or electrical coupling or connection. In addition, the term "coupling" or "connection" may comprehensively refer to direct or indirect coupling or connection and integral or non-integral coupling or connection.

It will be understood that in case that an element or a layer is referred to as being "on" another element or a layer, it can be directly on, connected to, or coupled to the other element or the layer, or one or more intervening elements or layers may be present. Like reference numerals refer to like elements throughout.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within $\pm30\%$, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described in detail with reference to the accompanying drawings.

Figures 3, 4:
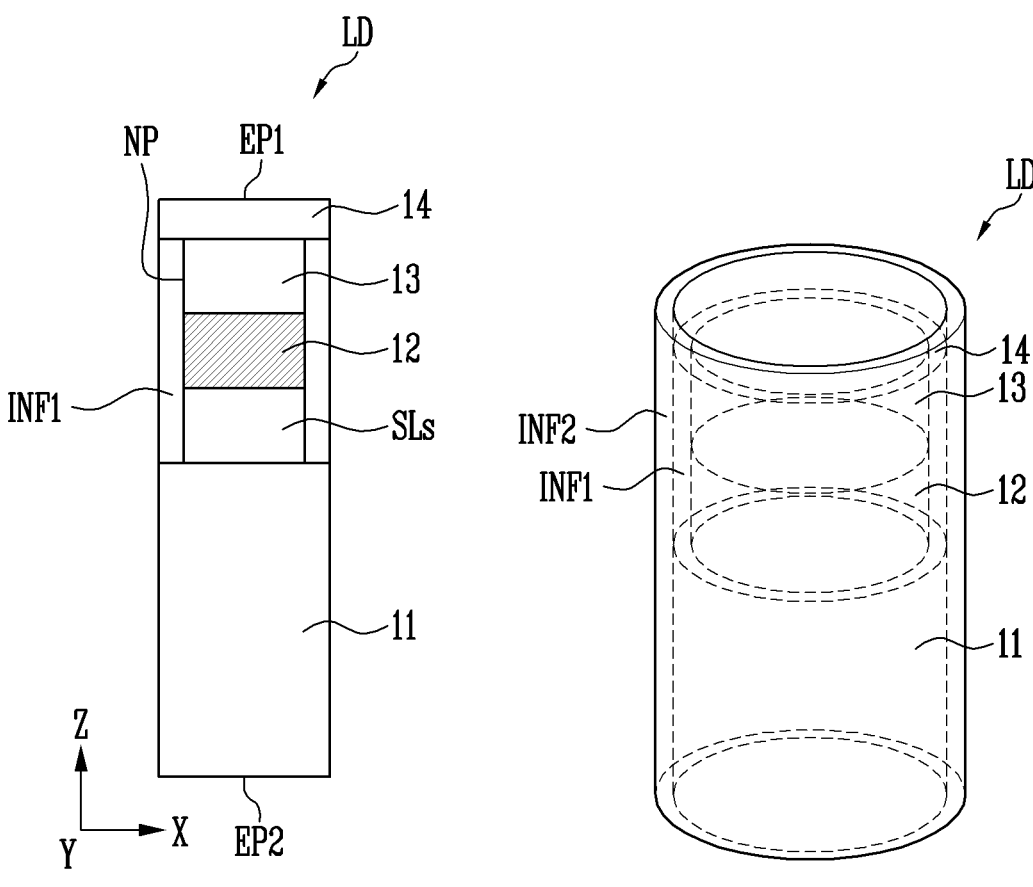
FIG. 4 is a schematic perspective view illustrating a light emitting element in accordance with an embodiment.

FIG. 1 is a schematic perspective view illustrating a light emitting element in accordance with an embodiment. FIGS. 2 and 3 are schematic sectional views each illustrating a light emitting element in accordance with an embodiment. Although FIGS. 1 to 3 illustrate a column-type light emitting element LD, the type and/or shape of the light emitting element LD is not limited thereto.

Referring to FIGS. 1 to 3, the light emitting element LD may include a first semiconductor layer 11, an active layer 12, a second semiconductor layer 13, an electrode layer 14, and/or a first insulating film INF1.

The light emitting element LD may be provided in the form of a column extending in one direction or a direction. The light emitting element LD may include a first end EP1 and a second end EP2. One of the first and second semiconductor layers 11 and 13 may be disposed on the first end EP1 of the light emitting element LD. The other one of the first and second semiconductor layers 11 and 13 may be disposed on the second end EP2 of the light emitting element LD. For example, the second semiconductor layer 13 may be disposed on the first end EP1 of the light emitting element LD, and the first semiconductor layer 11 may be disposed on the second end EP2 of the light emitting element LD.

In an embodiment, the light emitting element LD may be a light emitting element fabricated in a column shape through an etching scheme or the like within the spirit and the scope of the disclosure. In the specification, the term "column-type" embraces a rod-like shape and a bar-like shape such as a cylindrical shape and a prismatic shape having an aspect ratio greater than 1, and the cross-sectional shape thereof is not limited. It is to be understood that the shapes disclosed herein may also include shapes substantial to those shapes disclosed herein.

The light emitting element LD may have a small size corresponding to a range from the nanometer scale to the micrometer scale. For example, the light emitting element LD may have a diameter (or a width) and/or a length ranging from the nanometer scale to the micrometer scale. However, the size of the light emitting element LD is not limited thereto, and the size of the light emitting element LD may be changed in various ways depending on design conditions of various devices, for example, a display device, using a light emitting element with the light emitting element LD as a light source.

The first semiconductor layer 11 may be a first conductive semiconductor layer. For example, the first semiconductor layer 11 may include an n-type semiconductor layer. For instance, the first semiconductor layer 11 may include an n-type semiconductor layer which may include at least one semiconductor material of InAlGaN, GaN, AlGaN, InGaN, and AlN, and is doped with a first conductive dopant such as Si, Ge, or Sn. However, the material for forming the first semiconductor layer 11 is not limited thereto, and the first semiconductor layer 11 may be formed of various other materials.

The first insulating film INF1 may be disposed on the first semiconductor layer 11. The first insulating film INF1 may cover or overlap a surface of the active layer 12 and/or a surface of the second semiconductor film 13. The insulating film INF1 may prevent the active layer 12 from short-circuiting due to making contact with conductive material except the first and second semiconductor layers 11 and 13. Furthermore, the first insulating film INF1 may minimize a surface defect of the light emitting elements LD, thus enhancing the lifetime and emission efficiency of the light emitting elements LD.

The first insulating film INF1 may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium dioxide ($TiO_x$), but the disclosure is not limited thereto.

The first insulating film INF1 may include a nano-pattern NP. In an embodiment, a diameter D2 of the nano-pattern NP of the first insulating film INF1 may be less than a diameter D1 of the first semiconductor layer 11.

The nano-pattern NP of the first insulating film INF1 may function as a structure for growth of the active layer 12 and/or the second semiconductor layer 13. In other words, the active layer 12 and/or the second semiconductor layer 13 may be formed in the nano-pattern NP of the first insulating film INF1. The nano-pattern NP of the first insulating film INF1 may pass through the first insulating film INF1 in a third direction (a Z-axis direction) and allow a top surface of the first semiconductor layer 11 to be exposed.

The active layer 12 may be disposed in the nano-pattern NP of the first insulating film INF1. The active layer 12 may include any one structure of a single well structure, a multi-well structure, a single-quantum well structure, a multi-quantum well (MQW) structure, a quantum dot structure, and a quantum line structure, but the disclosure is not limited thereto. The active layer 12 may include GaN, InGaN, InAlGaN, AlGaN, or AlN. Various other materials may be used to form the active layer 12.

The active layer 12 may be disposed between the first semiconductor layer 11 and the second semiconductor layer 13. In an embodiment, as illustrated in FIG. 2, the active layer 12 may be formed on or directly formed on the top surface of the first semiconductor layer 11 that is exposed by the nano-pattern NP of the first insulating film INF1. In an embodiment, as illustrated in FIG. 3, a superlattice layer SLs may be further disposed in the nano-pattern NP of the first insulating film INF1. The superlattice layer SLs may be disposed between the active layer 12 and the first semiconductor layer 11. The superlattice layer SLs may relieve stress of the active layer 12 and the first semiconductor layer 11, thus enhancing the quality of the light emitting elements LD. For example, the superlattice layer SLs may have a structure formed by alternately stacking layers made of InGaN and layers made of GaN, but the disclosure is not limited thereto.

If a voltage equal to or greater than a threshold voltage is applied between the opposite ends of the light emitting element LD, the light emitting element LD may emit light by coupling of electron-hole pairs in the active layer 12. Since light emission of the light emitting element LD can be controlled based on the foregoing principle, the light emitting element LD may be used as a light source of various light emitting elements as well as a pixel of the display device.

The second semiconductor layer 13 may be disposed on the active layer 12 in the nano-pattern NP of the first insulating film INF1. The second semiconductor layer 13 may include a semiconductor layer having a type different from that of the first semiconductor layer 11. The second semiconductor layer 13 may include a p-type semiconductor layer. For instance, the second semiconductor layer 13 may include a p-type semiconductor layer which may include any one semiconductor material of InAlGaN, GaN, AlGaN, InGaN, or AlN, and is doped with a second conductive dopant such as Mg. However, the material for forming the second semiconductor layer 13 is not limited thereto, and the second semiconductor layer 13 may be formed of various other materials.

The electrode layer 14 may be disposed on the first end EP1 and/or the second end EP2 of the light emitting element LD. Although FIGS. 2 and 3 illustrate that the electrode layer 14 is formed on the second semiconductor layer 13 and/or the first insulating film INF1, the disclosure is not limited thereto. For example, a separate electrode layer may be further disposed on the first semiconductor layer 11.

The electrode layer 14 may include transparent metal or transparent metal oxide. For example, the electrode layer 14 may include at least one of indium tin oxide (ITO), indium zinc oxide (IZO), and zinc tin oxide (ZTO), but the disclosure is not limited thereto. As such, in case that the electrode layer 14 is formed of transparent metal or transparent metal oxide, light generated from the active layer 12 of the light emitting element LD may be emitted out of the light emitting element LD through the electrode layer 14.

A light emitting element including the light emitting element LD described above may be used not only in a display device but also in various devices which requires a light source. For instance, light emitting elements LD may be disposed in each pixel of a display panel, so that the light emitting elements LD may be used as a light source of the pixel. However, the application field of the light emitting element LD is not limited to the above-mentioned examples. For example, the light emitting element LD may also be used in other types of devices such as a lighting device, which requires a light source.

In an embodiment, the light emitting element LD may be a red light emitting element to emit red light. For example, the active layer 12 may emit light having a wavelength ranging from approximately 630 nm to approximately 750 nm, corresponding to red. By way of example, the light emitting element LD may be a green light emitting element to emit green light. For example, the active layer 12 may emit light having a wavelength ranging from approximately 495 nm to approximately 570 nm, corresponding to green. As described above, in case that the active layer 12 and/or the second semiconductor layer 13 is formed in the nano-pattern NP of the first insulating film INF1, strain due to a difference in lattice constant between indium (In) and gallium (Ga) may be relieved even if a composition ratio of indium (In) is increased so as to embody a red or green light emitting element LD. In other words, since a defect of the active layer 12, indium cluster, and quantum-confined stark effect (QCSE) may be minimized, a high-efficiency red and/or green light emitting element LD may be fabricated. A color conversion layer and/or a color filter layer that is additionally formed on the light emitting element LD can be omitted, so that a process of fabricating the display device may be facilitated, and the production cost thereof may be reduced. However, the disclosure is not limited the foregoing. The light emitting element LD may be a blue light emitting element to emit blue light.

During the process of fabricating the light emitting element LD, an etching operation may be performed while the active layer 12 is protected by the first insulating film INF1, so that the light emitting element LD can be fabricated without damage to a sidewall of the active layer 12. Consequently, the efficiency and reliability of the light emitting elements LD may be enhanced. Detailed descriptions pertaining thereto will be made with reference to FIGS. 6 to 12.

Hereinafter, an embodiment will be described. In descriptions of the following embodiment, like reference numerals will be used to designate the above-described configurations and the same components, and redundant explanation thereof will be omitted or simplified.

Figure 5:
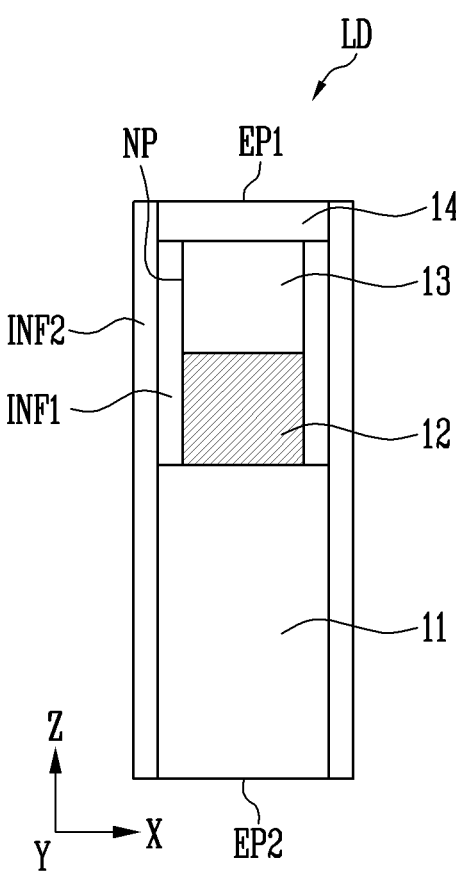
FIG. 5 is a schematic sectional view illustrating the light emitting element in accordance with an embodiment.

FIG. 4 is a schematic perspective view illustrating a light emitting element in accordance with an embodiment. FIG. 5 is a schematic sectional view illustrating the light emitting element in accordance with an embodiment.

Referring to FIGS. 4 and 5, the embodiment differs from that of FIGS. 1 to 3 in that the embodiment may further include a second insulating film INF2 disposed on the first insulating film INF1.

For example, the second insulating film INF2 may be disposed on or directly disposed on a surface of the first insulating film INF1. Furthermore, the second insulating film INF2 may enclose the first semiconductor layer 11 that is exposed from the first insulating film INF1. The second insulating film INF2 may be disposed on or directly disposed on the surface of the first semiconductor layer 11 that is exposed from the first insulating film INF1. In other words, the second insulating film INF2 may entirely protect the first semiconductor layer 11, the active layer 12, and/or the second semiconductor layer 13, and minimize damage to the light emitting elements LD, thus enhancing the efficiency and the reliability. The second insulating film INF2 may allow the first and second ends EP1 and EP2 of the light emitting element LD that have different polarities to be exposed.

In an embodiment, the second insulating film INF2 may include a same material or a similar material as that of the first insulating film INF1. For example, the second insulating film INF2 may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium dioxide ($TiO_x$). However, the disclosure is not limited the foregoing. The material of the second insulating film INF2 may be changed in various ways so long as the second insulating film INF2 can protect the surfaces of the light emitting elements LD.

Since the first semiconductor layer 11, the active layer 12, the second semiconductor layer 13, the first insulating film INF1, and/or the electrode layer 14 have been described in detail with reference to FIGS. 1 to 3, redundant description thereof will be omitted.

A method of fabricating the light emitting element in accordance with the foregoing embodiments will be described.

FIGS. 6 to 12 are schematic sectional views illustrating, by process steps, the method of fabricating a light emitting element in accordance with an embodiment. FIGS. 6 to 12 are schematic sectional views for describing the method of fabricating the light emitting element LD of FIG. 2. Like references will be used to designate substantially the same components as those of the embodiment of FIG. 2, and detailed explanation thereof will be omitted.

Figure 6:
FIGS. 6 to 12 are schematic sectional views illustrating, by process steps, a method of fabricating a light emitting element in accordance with an embodiment.

Referring to FIG. 6, the first semiconductor layer 11 may be formed on a stack substrate 1.

The stack substrate 1 may include a sapphire substrate and a transparent substrate made of material such as glass. However, the disclosure is not limited the foregoing. The stack substrate 1 may be formed of a conductive substrate made of material such as GaN, SiC, ZnO, Si, GaP, and GaAs. Hereinafter, the case where the stack substrate 1 is a sapphire substrate will be described by way of example.

In an embodiment, a buffer layer 2 may be formed between the stack substrate 1 and the first semiconductor layer 11. The buffer layer 2 may function to reduce a difference in lattice constant between the stack substrate 1 and the first semiconductor layer 11. For example, the buffer layer 2 may include an undoped semiconductor, and include material that is substantially the same as that of the first semiconductor layer 11 and is not doped with an n-type or p-type dopant. In an embodiment, the buffer layer 2 may include at least one material among InAlGaN, GaN, AlGaN, InGaN, and AlN that are undoped, but the disclosure is not limited thereto.

The first semiconductor layer 11 may be formed by growing a seed crystal by an epitaxial method. In an embodiment, the first semiconductor layer 11 may be formed by an electron beam deposition method, a physical vapor deposition (PVD) method, a chemical vapor deposition (CVD) method, a plasma laser deposition (PLD) method, a dual-type thermal evaporation method, a sputtering method, or a metal organic chemical vapor deposition (MOCVD) method. It is desirable that the first semiconductor layer 11 be formed by the MOCVD method, but the disclosure is not limited thereto.

Figure 7:
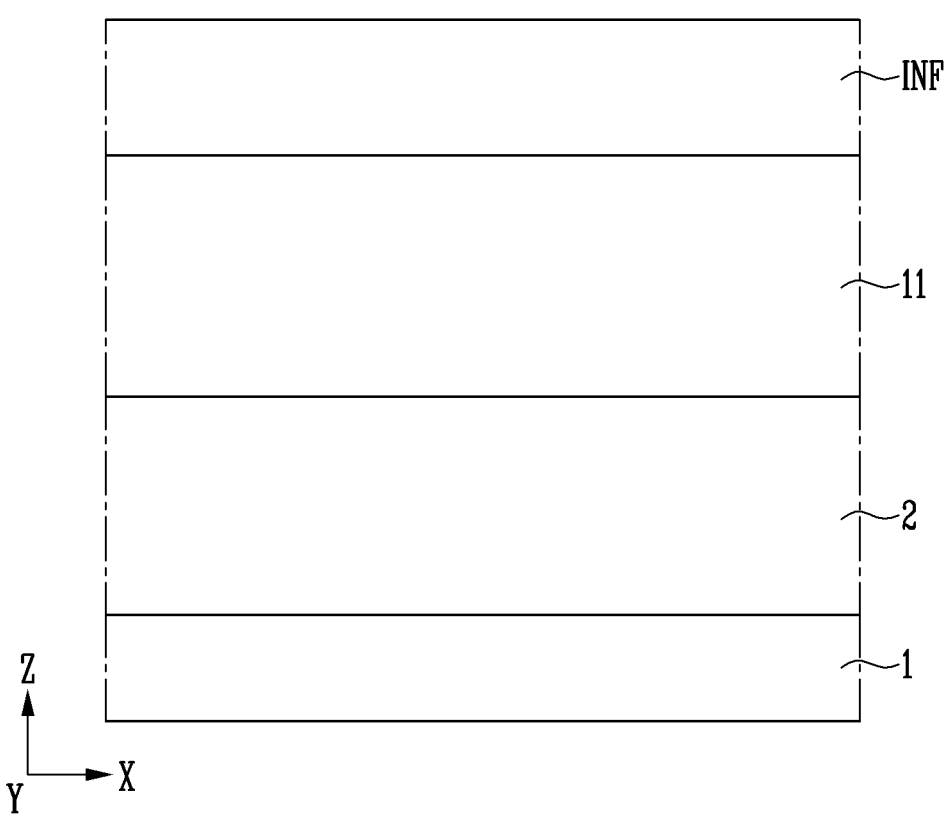

Thereafter, referring to FIG. 7, the first insulating film INF1 may be formed on the first semiconductor layer 11. The first insulating film INF1 may be disposed on or directly disposed on the first semiconductor layer 11. The first insulating film INF1 may be formed of at least one of silicon oxide ($SiO_x$), silicon nitride ($SiN_x$), silicon oxynitride (Si-$O_xN_y$), aluminum nitride ($AlN_x$), aluminum oxide ($AlO_x$), zirconium oxide ($ZrO_x$), hafnium oxide ($HfO_x$), and titanium dioxide ($TiO_x$), but the disclosure is not limited thereto.

Figure 8:
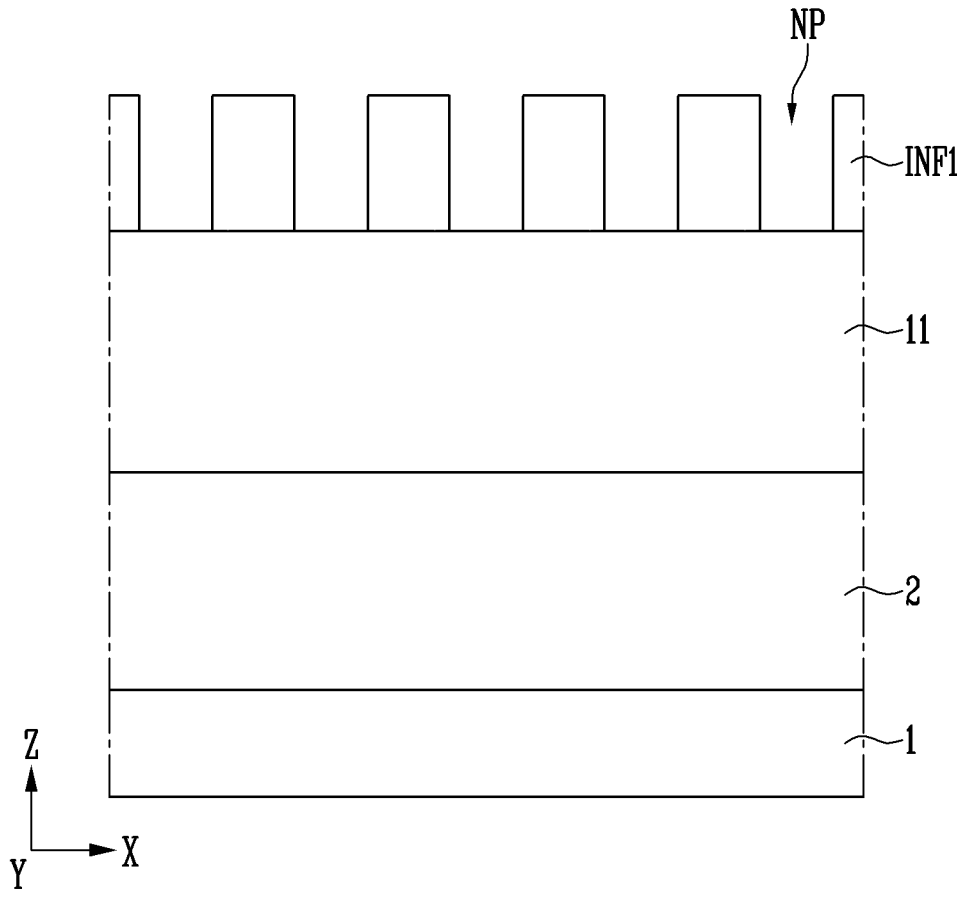

Thereafter, referring to FIG. 8, nano-patterns NP may be formed by etching the first insulating film INF1. The nano-patterns NP may pass through the first insulating film INF1 and allow the top surface of the first semiconductor layer 11 to be exposed. A process of etching the first insulating film INF1 may be performed by a given method. For example, the etching process may be performed by a dry etching method, a wet etching method, a reactive ion etching (RIE) method, an inductively coupled plasma reactive ion etching (ICP-RIE) method, or the like within the spirit and the scope of the disclosure.

Figure 9:
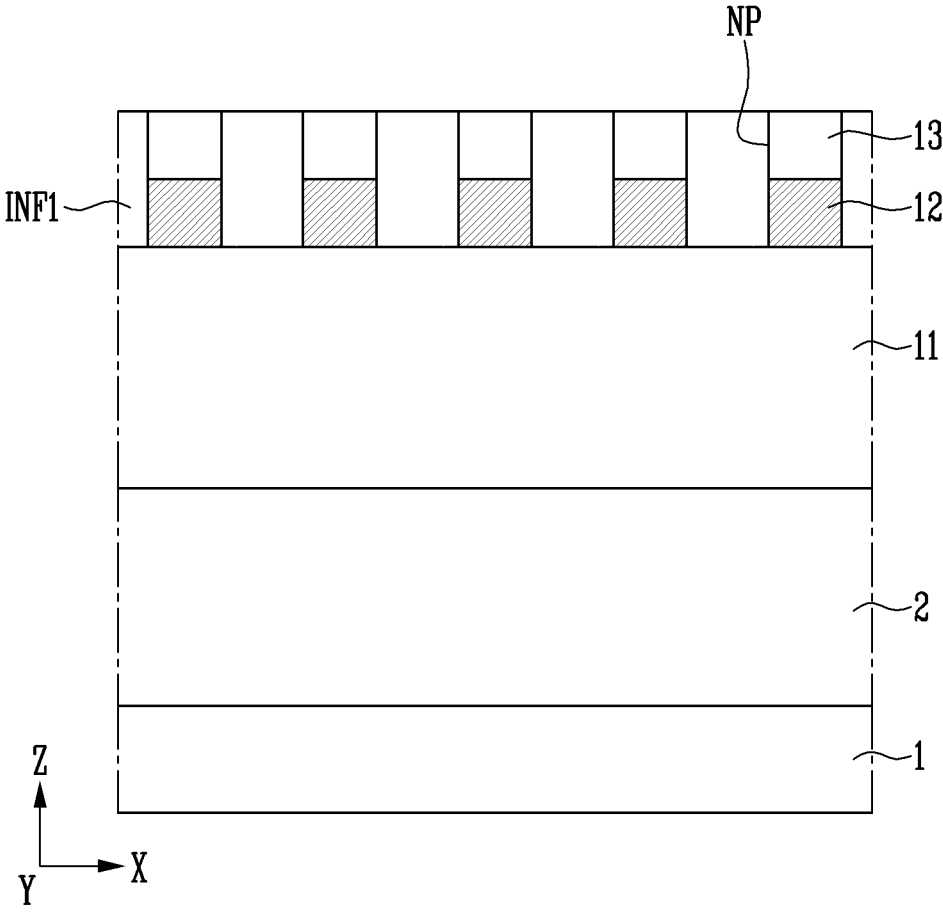

Subsequently, referring to FIG. 9, the active layer 12 and/or the second semiconductor layer 13 may be formed in the nano-patterns NP of the first insulating film INF1. The active layer 12 and the second semiconductor layer 13 may be formed by growing a seed crystal by an epitaxial method. In an embodiment, the active layer 12 and the second semiconductor layer 13 may be formed by an electron beam deposition method, a physical vapor deposition (PVD) method, a chemical vapor deposition (CVD) method, a plasma laser deposition (PLD) method, a dual-type thermal evaporation method, a sputtering method, or a metal organic chemical vapor deposition (MOCVD) method. It is desirable that the active layer 12 and the second semiconductor layer 13 may be formed by the MOCVD method, but the disclosure is not limited thereto.

As described above, in case that the active layer 12 and/or the second semiconductor layer 13 are formed in the nano-pattern NP of the first insulating film INF1, strain due to a difference in lattice constant between indium (In) and gallium (Ga) may be relieved even if a composition ratio of indium (In) is increased so as to embody a red or green light emitting element LD. In other words, since a defect of the active layer 12, indium cluster, and quantum-confined stark effect (QCSE) may be minimized, a high-efficiency red and/or green light emitting element LD may be fabricated, as described above.

Figure 10:
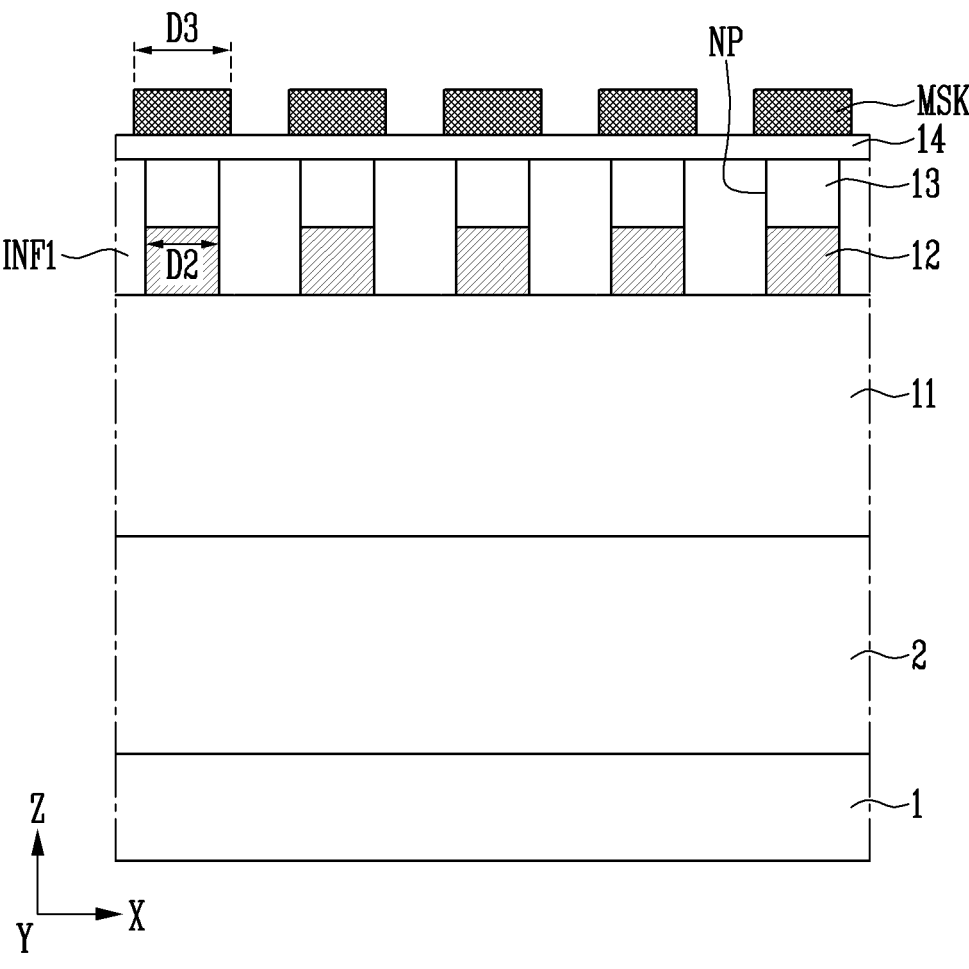

Thereafter, referring to FIG. 10, the electrode layer 14 may be formed on the second semiconductor layer 13 and/or the first insulating film INF1, and a mask MSK may be formed on the electrode layer 14.

The electrode layer 14 may be formed on an overall surface of the stack substrate 1. The mask MSK may be partially formed on the electrode layer 14 to overlap the nano-patterns NP of the first insulating film INF1 in the third direction (in the Z-axis direction). The mask MSK may partially expose the first insulating film INF between the nano-patterns NP. For example, the mask MSK may be partially formed to completely overlap the nano-patterns NP of the first insulating film INF1 in the third direction (in the Z-axis direction). For instance, a diameter D3 of the mask MSK may be greater than a diameter D2 of each of the nano-patterns NP. Therefore, portions of the first insulating film INF1 that overlap the mask MSK may not be etched. In other words, during a process of etching the first insulating film INF1 or the like, the portions of the first insulating film INF1 that overlap the mask MSK may protect the active layer 12 and/or the second semiconductor layer 13 that are disposed in the nano-patterns NP.

Figure 11:
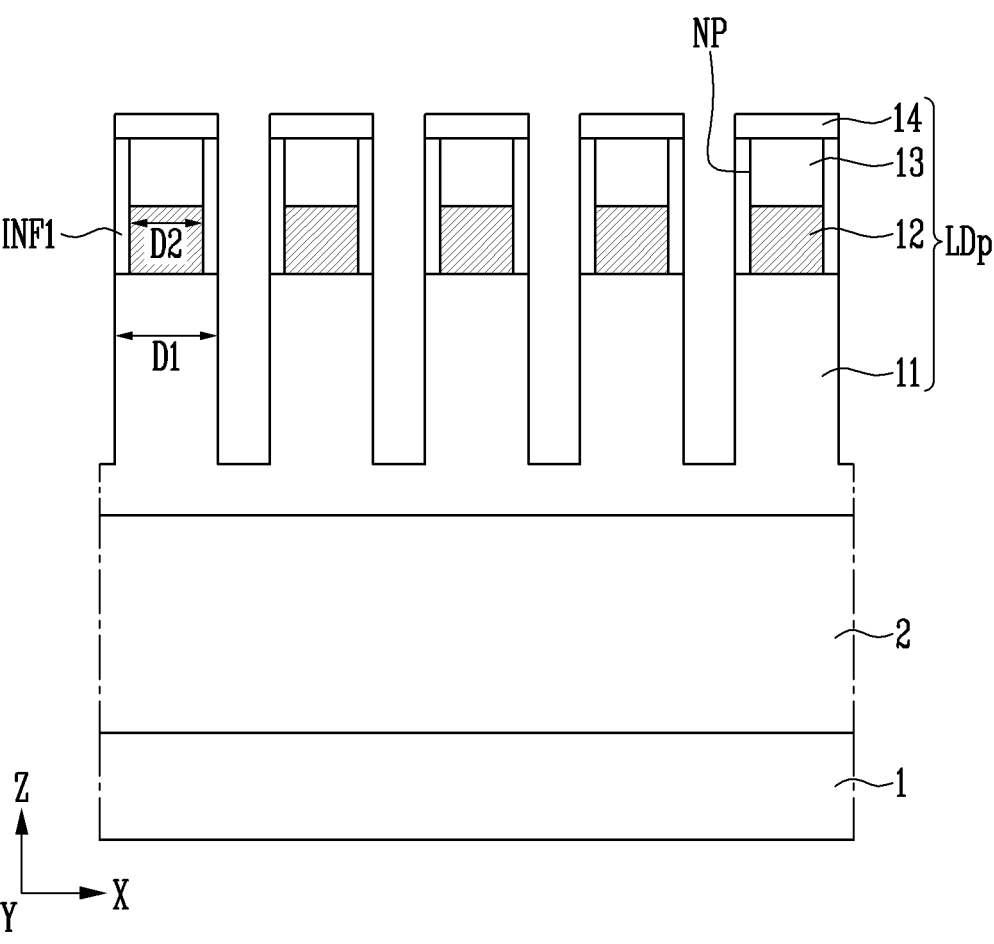

Thereafter, referring to FIG. 11, light emitting patterns LDp may be formed by partially etching the electrode layer 14, the first insulating film INF1, and/or the first semiconductor layer 11. During a process of forming the light emitting patterns LDp, the electrode layer 14, the first insulating film INF1, and/or the first semiconductor layer 11 that are exposed from the mask MSK may be partially etched. Hence, a diameter D1 of each of the formed light emitting patterns LDp may be substantially the same as the diameter D3 of the mask MSK, but the disclosure is not limited thereto.

At the step of partially etching the electrode layer 14, the first insulating film INF1, and/or the first semiconductor layer 11, the active layer 12 and/or the second semiconductor layer 13 may be protected by the portions of the first insulating film INF1 that overlap the mask MSK. In other words, the sidewall of the active layer 12 may be prevented from being damaged by etching, so that the efficiency and reliability of the light emitting element LD can be enhanced, as described above.

A process of etching the first insulating film INF1 and the first semiconductor layer 11 may be performed by a given method. For example, the etching process may be performed by a dry etching method, a wet etching method, a reactive ion etching (RIE) method, an inductively coupled plasma reactive ion etching (ICP-ME) method, or the like within the spirit and the scope of the disclosure.

Figure 12:
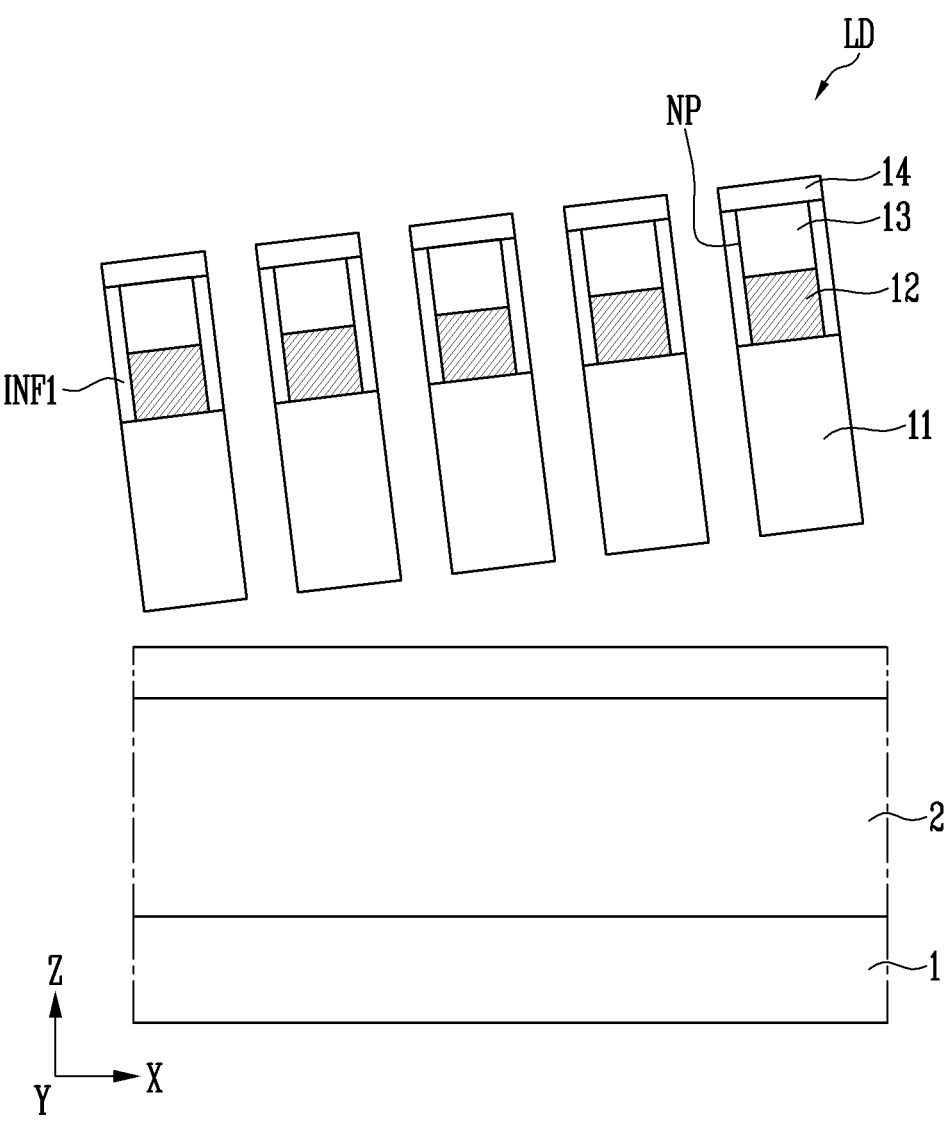

Thereafter, referring to FIG. 12, the light emitting patterns LDp may be separated from the stack substrate 1, thus forming the light emitting elements LD shown in FIG. 2. According to the method of fabricating the light emitting element LD in accordance with an embodiment, the active layer 12 and/or the second semiconductor layer 13 may be formed in the nano-patterns NP of the first insulating film INF1, so that strain due to a difference in lattice constant between indium (In) and gallium (Ga) can be relieved. Consequently, a high-efficiency red and/or green light emitting element LD may be fabricated. At the step of partially etching the electrode layer 14, the first insulating film INF1, and/or the first semiconductor layer 11, the active layer 12 and/or the second semiconductor layer 13 may be protected by the first insulating film INF1, so that the sidewall of the active layer 12 can be prevented from being damaged, and the efficiency and reliability of the light emitting element LD can be enhanced, as described above.

Hereinafter, an embodiment will be described. In descriptions of the following embodiment, like reference numerals will be used to designate the above-described configurations and the same components, and redundant explanation thereof will be omitted or simplified.

Figure 13:
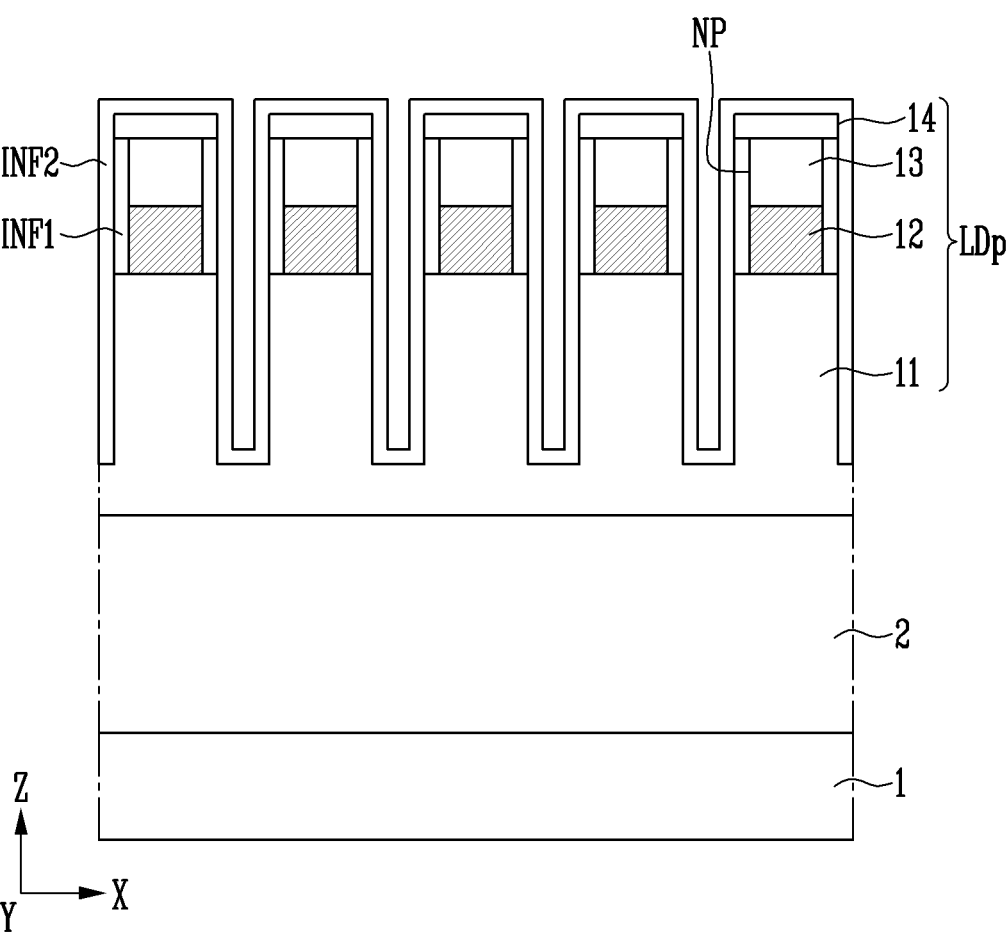
FIGS. 13 to 15 are schematic sectional views illustrating, by process steps, a method of fabricating a light emitting element in accordance with an embodiment.
Figure 14:
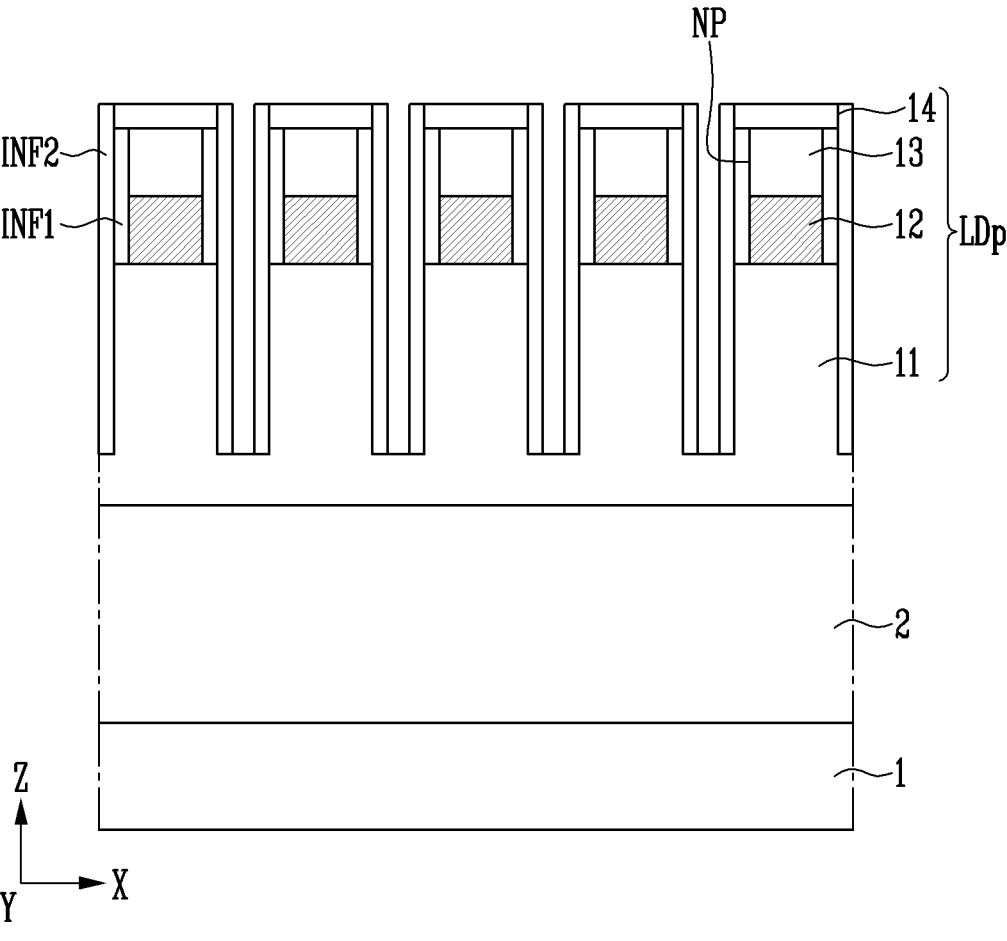
Figure 15:
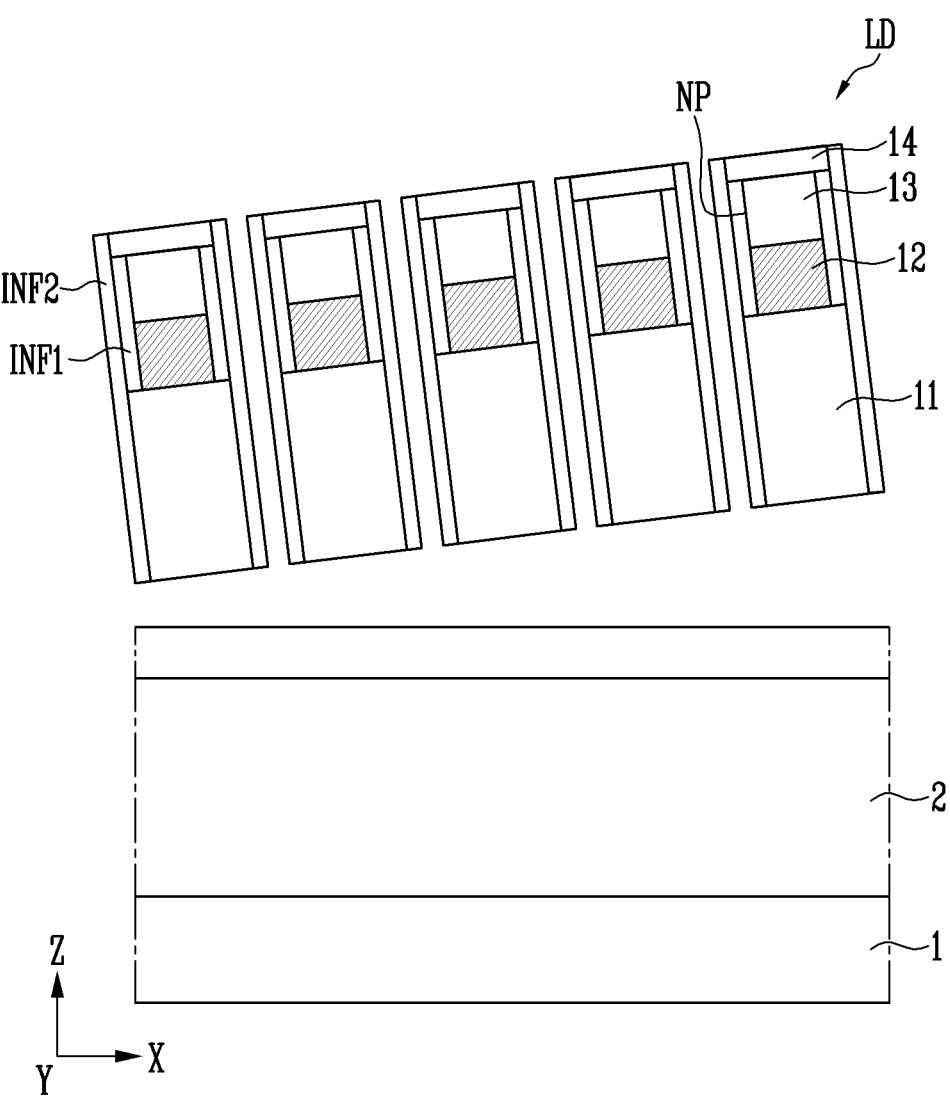

FIGS. 13 to 15 are schematic sectional views illustrating, by process steps, a method of fabricating a light emitting element in accordance with an embodiment. FIGS. 13 to 15 are schematic sectional views for describing the method of fabricating the light emitting element LD of FIG. 5. Like references will be used to designate substantially the same components as those of the embodiment of FIG. 5, and detailed explanation thereof will be omitted.

Referring to FIG. 13, the second insulating film INF2 may be formed on the light emitting patterns LDp. A process of forming the light emitting patterns LDp has been described in detail with reference to FIGS. 6 to 11, and redundant description thereof will be omitted.

The second insulating film INF2 may be formed on the first insulating film INF1. Furthermore, the second insulating film INF2 may enclose the first semiconductor layer 11 that is exposed from the first insulating film INF1. The second insulating film INF2 may entirely protect the first semiconductor layer 11, the active layer 12, and/or the second semiconductor layer 13, and minimize damage to the light emitting elements LD, thus enhancing the efficiency and the reliability, as described above.

In an embodiment, the second insulating film INF2 may include a same material or a similar material as that of the first insulating film INF1. For example, the second insulating film INF2 may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium dioxide ($TiO_x$). However, the disclosure is not limited the foregoing. The material of the second insulating film INF2 may be changed in various ways so long as the second insulating film INF2 can protect the surfaces of the light emitting elements LD.

Thereafter, referring to FIG. 14, the top surfaces of the light emitting patterns LDp may be exposed by partially removing the second insulating film INF2. For example, the second insulating film INF2 that is formed on the electrode layer 14 of each of the light emitting patterns LDp may be partially etched and removed. Consequently, the electrode layers 14 of the light emitting patterns LDp may be exposed.

Thereafter, referring to FIG. 15, the light emitting patterns LDp may be separated from the stack substrate 1, thus forming the light emitting elements LD shown in FIG. 5.

A display device including the light emitting element in accordance with the foregoing embodiments will be described.

Figure 16:
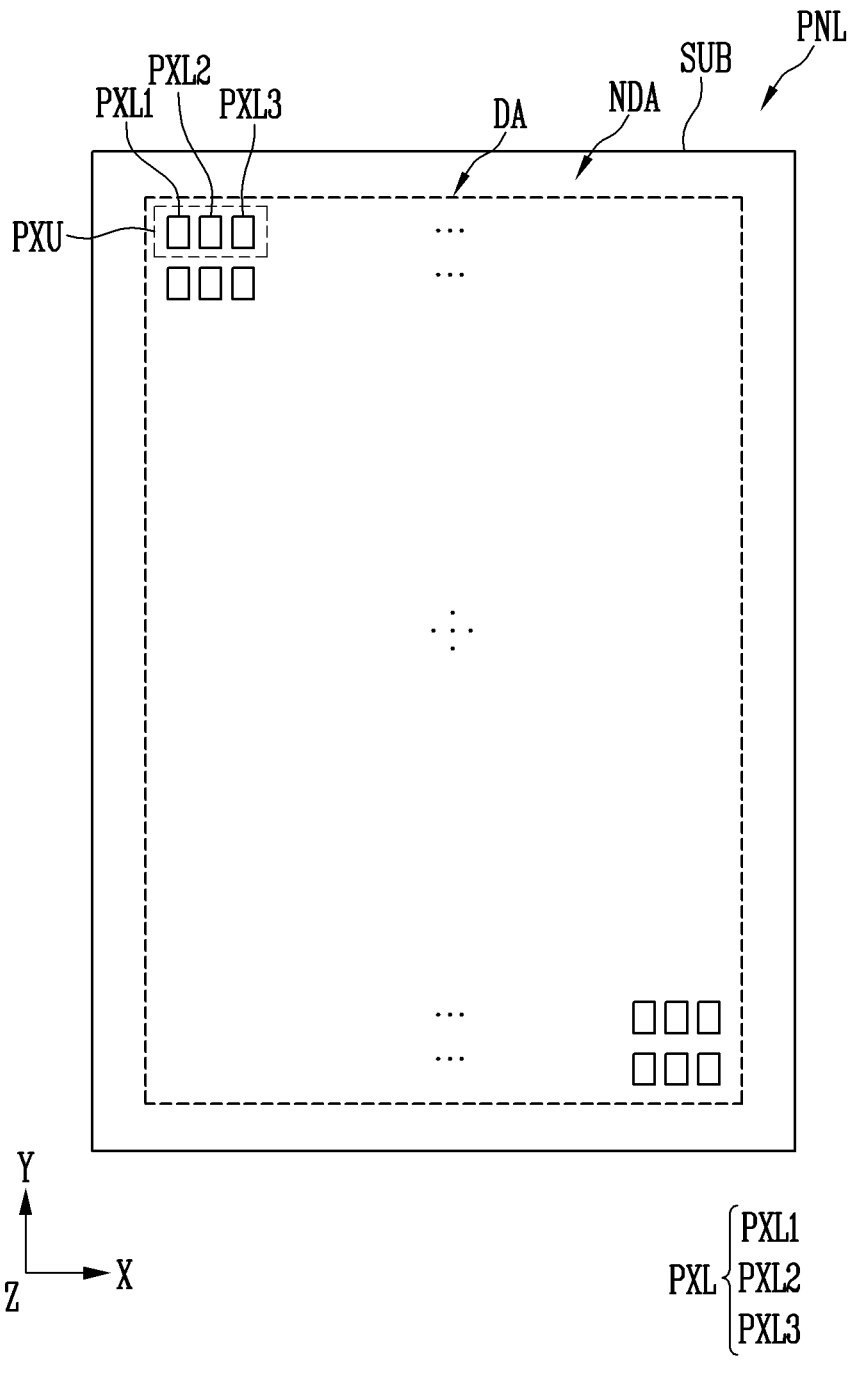
FIG. 16 is a schematic plan view illustrating a display device in accordance with an embodiment.

FIG. 16 is a schematic plan view illustrating a display device in accordance with an embodiment.

FIG. 16 illustrates a display device, for example, a display panel PNL provided in the display device, as an example of an electronic device which may use, as a light source, the light emitting element LD described in the embodiments of FIGS. 1 to 5.

Each pixel unit PXU of the display panel PNL and each sub-pixel PXL for forming the pixel unit PXU may include at least one light emitting element LD. For the sake of explanation, FIG. 16 simply illustrates the structure of the display panel PNL in accordance with an embodiment, focused on a display area DA. In an embodiment, although not illustrated, at least one driving circuit (for example, at least one of a scan driver and a data driver), lines, and/or pads may be further provided on the display panel PNL.

Referring to FIG. 16, the display panel PNL may include a substrate SUB, and a pixel unit PXU disposed on the substrate SUB. The pixel unit PXU may include a first sub-pixel PXL1, a second sub-pixel PXL2, and/or a third sub-pixel PXL3. Hereinafter, the term "sub-pixel PXL" or "sub-pixels PXL" will be used to arbitrarily designate any one sub-pixel of the first sub-pixel PXL1, the second sub-pixel PXL2, and the third sub-pixel PXL3, or collectively designate two or more kinds of sub-pixels.

The substrate SUB may form a base of the display panel PNL and be a rigid or flexible substrate or film. For example, the substrate SUB may be a rigid substrate made of glass or reinforced glass, a flexible substrate (or a thin film) formed of plastic or metal, and the material and/or properties of the substrate SUB are not particularly limited.

The display panel PNL and the substrate SUB for forming the display panel PNL may include a display area DA for displaying an image, and a non-display area NDA formed in an area other than the display area DA. The sub-pixels PXL may be disposed in the display area DA. Various lines, pads, and/or internal circuits which are connected to the sub-pixels PXL of the display area DA may be disposed in the non-display area NDA. The sub-pixels PXL may be regularly arranged (or disposed) according to a stripe or PENTILE™ arrangement structure. The arrangement structure of the sub-pixels PXL is not limited thereto, and the sub-pixels PXL may be arranged in the display area DA in various structures and/or schemes.

In an embodiment, two or more kinds of sub-pixels PXL which emit different colors of light may be disposed in the display area DA. For example, first sub-pixels PXL1 may emit a first color of light, second sub-pixels PXL2 may emit a second color of light, and third sub-pixels PXL3 may emit a third color of light may be arranged in the display area DA. At least one first sub-pixel PXL1, at least one second sub-pixel PXL2, and at least one third sub-pixel PXL3 that are disposed adjacent to each other may form one pixel unit PXU which may emit various colors of light. For example, each of the first to third sub-pixels PXL1, PXL2, and PXL3 may be a sub-pixel that emits a selected or given color of light. In an embodiment, the first sub-pixel PXL1 may be a red pixel may emit red light, a second sub-pixel PXL2 may be a green pixel that emits green light, and a third sub-pixel PXL3 may be a blue light that emits blue light. However, the disclosure is not limited thereto.

In an embodiment, the first sub-pixel PXL1, the second sub-pixel PXL2, and the third sub-pixel PXL3 may respectively include light emitting elements that emit a same color of light, and color conversion layers and/or color filters pertaining to different colors may be disposed on the respective light emitting elements so that the first, second, and third sub-pixels PXL1, PXL2, and PXL3 may respectively emit the first color of light, the second color of light, and the third color of light. In an embodiment, the first sub-pixel PXL1, the second sub-pixel PXL2, and the third sub-pixel PXL3 may include, as light sources, a light emitting element related to the first color, a light emitting element related to the second color, and a light emitting element related to the third color, so that the sub-pixels may respectively emit the first color of light, the second color of light, and the third color of light. However, the colors, the types, and/or the number of sub-pixels PXL that form each pixel unit PXU are not particularly limited. In other words, the color of light to be emitted from each sub-pixel PXL may be changed in various ways.

The sub-pixel PXL may include at least one light source that is driven by a control signal (for example, a scan signal and a data signal) and/or a power supply (for example, a first power supply and a second power supply). In an embodiment, the light source may include at least one light emitting element LD in accordance with any one of the embodiments of FIGS. 1 and 2, for example, subminiature column-type light emitting elements LD having a small size corresponding to a range from the nanometer scale to the micrometer scale. However, the disclosure is not limited thereto, and different types of light emitting elements LD may be used as a light source of the sub-pixel PXL.

In an embodiment, each sub-pixel PXL may be formed of an active pixel. However, the types, structures, and/or driving schemes of the sub-pixels PXL applicable to the display device are not particularly limited. For example, each sub-pixel PXL may be formed of a pixel for passive or active light emitting display devices which have various structures and/or may be operated in various driving schemes.

Figure 17:
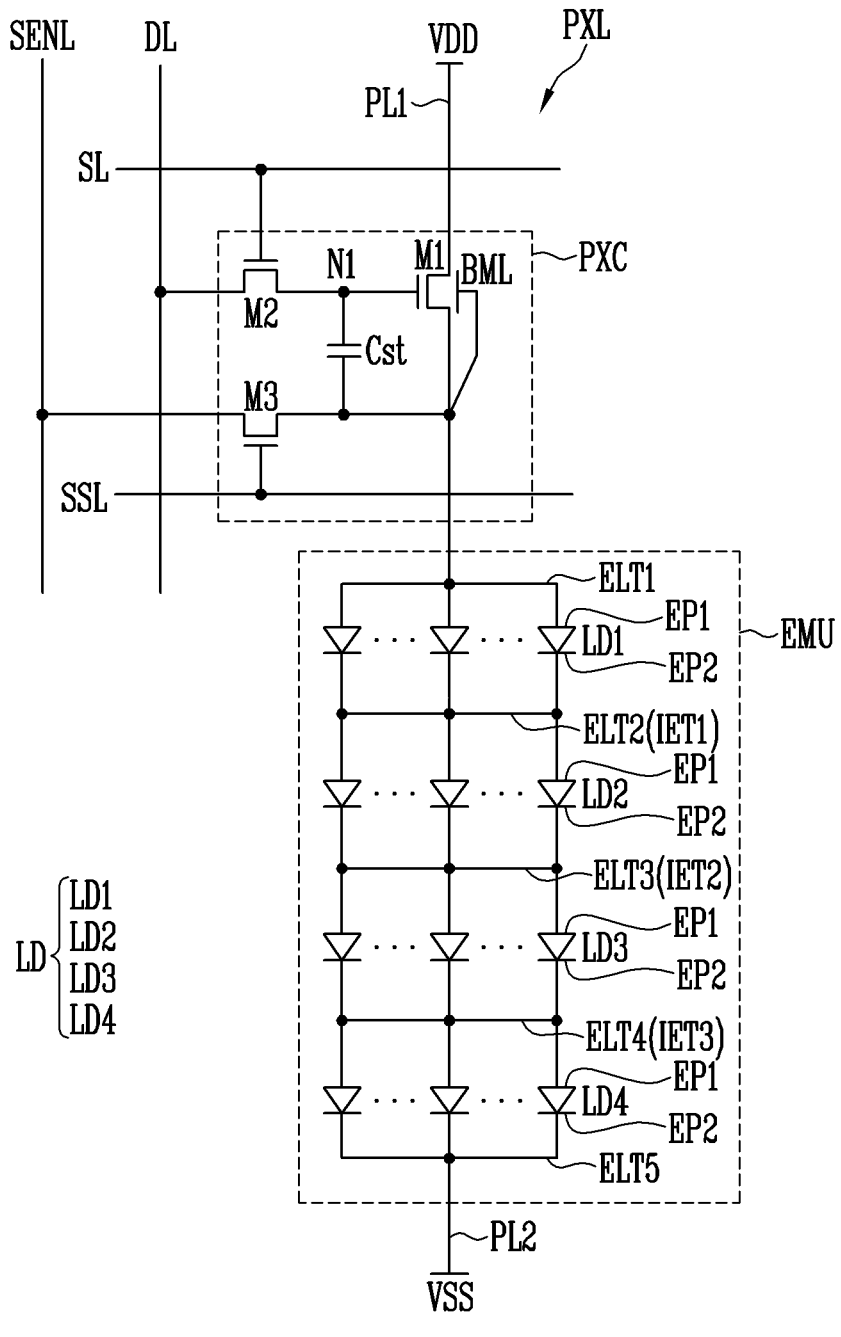
FIG. 17 is a schematic diagram of an equivalent circuit illustrating a sub-pixel in accordance with an embodiment.

FIG. 17 is a schematic diagram of an equivalent circuit illustrating a sub-pixel PXL in accordance with an embodiment.

The sub-pixel PXL illustrated in FIG. 17 may be any one of the first sub-pixel PXL1, the second sub-pixel PXL2, and the third sub-pixel PXL3 that are provided on the display panel PNL of FIG. 16. The first sub-pixel PXL1, the second sub-pixel PXL2, and the third sub-pixel PXL3 may have a substantially identical or similar structure.

Referring to FIG. 17, each sub-pixel PXL may include an emission circuit EMU that generates light having luminance corresponding to a data signal, and a pixel circuit PXC that drives the emission circuit EMU.

The pixel circuit PXC may be connected between the first power supply VDD and the emission circuit EMU. Furthermore, the pixel circuit PXC may be connected to a scan line SL and a data line DL of the corresponding sub-pixel PXL, and control the operation of the emission circuit EMU in response to a scan signal and a data signal supplied from the scan line SL and the data line DL. Furthermore, the pixel circuit PXC may be selectively further connected to a sensing signal line SSL and a sensing line SENL.

The pixel circuit PXC may include at least one transistor and at least one capacitor. For example, the pixel circuit PXC may include a first transistor M1, a second transistor M2, a third transistor M3, and a storage capacitor Cst.

The first transistor M1 may be connected between the first power supply VDD and a first connection electrode ELT1. A gate electrode of the first transistor M1 may be connected to the first node N1. The first transistor M1 may control driving current to be supplied to the emission circuit EMU in response to a voltage of the first node N1. In other words, the first transistor M1 may be a driving transistor that controls the driving current of the sub-pixel PXL.

In an embodiment, the first transistor M1 may selectively include a bottom conductive layer BML (referred also to as "bottom electrode", "back gate electrode" or "bottom light shielding layer"). The gate electrode of the first transistor M1 and the bottom conductive layer BML may overlap each other with an insulating layer interposed therebetween. In an embodiment, the bottom conductive layer BML may be connected to one electrode of the first transistor M1, for example, a source or drain electrode of the first transistor M1.

In case that the first transistor M1 may include the bottom conductive layer BML, a back-biasing technique (or a sync technique) may be used, the back-biasing technique being a technique of shifting a threshold voltage of the first transistor M1 in a negative direction or a positive direction by applying a back-biasing voltage to the bottom conductive layer BML of the first transistor M1 when the sub-pixel PXL is driven. For example, a source-sync technique may be used by connecting the bottom conductive layer BML to the source electrode of the first transistor M1, so that the threshold voltage of the first transistor M1 may be shifted in the negative direction or the positive direction. In case that the bottom conductive layer BML is disposed under or below a semiconductor pattern that forms a channel of the first transistor M1, the bottom conductive layer BML may function as a light shielding pattern and stabilize operating characteristics of the first transistor N1. However, the function and/or application scheme of the bottom conductive layer BML is not limited thereto.

The second transistor M2 may be connected between the data line DL and the first node N1. A gate electrode of the second transistor M2 may be connected to the scan line SL. When a scan signal having a gate-on voltage (for example, a high-level voltage) is supplied from the scan line SL, the second transistor M2 may be turned on to connect the data line DL with the first node N1.

During each frame period, a data signal of a corresponding frame may be supplied to the data line DL, and the data signal may be transmitted to the first node N1 through the second transistor M2 that is turned on during a period in which the scan signal having the gate-on voltage is supplied to the scan line SL. In other words, the second transistor M2 may be a switching transistor that transmits each data signal to the interior of the sub-pixel PXL.

One electrode of the storage capacitor Cst may be connected to the first node N1, and the other electrode thereof may be connected to a second electrode of the first transistor M1. The storage capacitor Cst may be charged with a voltage corresponding to a data signal to be supplied to the first node N1 during each frame period.

The third transistor M3 may be connected between the first connection electrode ELT1 (or the second electrode of the first transistor M1) and the sensing line SENL. A gate electrode of the third transistor M3 may be connected to the sensing signal line SSL. The third transistor M3 may transmit a voltage value applied to the first connection electrode ELT1, to the sensing line SENL in response to a sensing signal supplied to the sensing signal line SSL. The voltage value transmitted through the sensing line SENL may be provided to an external circuit (for example, a timing controller). The external circuit may extract information about characteristics of each sub-pixel PXL (for example, a threshold voltage or the like of the first transistor M1) based on the provided voltage value. The extracted characteristic information may be used to convert image data to compensate for a deviation in characteristics between the sub-pixels PXL.

Although FIG. 17 illustrates the case where all of the transistors included in the pixel circuit PXC are formed of n-type transistors, the disclosure is not limited thereto. For example, at least one of the first, second, and third transistors M1, M2, and M3 may be changed to a p-type transistor.

The structure and driving scheme of the sub-pixel PXL may be changed in various ways. For instance, the pixel circuit PXC may not only be formed of the pixel circuit of the embodiment illustrated in FIG. 17 but may also be formed of a pixel circuit which may have various structures and/or be operated in various driving schemes.

For example, the pixel circuit PXC may not include the third transistor M3. Furthermore, the pixel circuit PXC may further include other circuit elements such as a compensation transistor that compensates for the threshold voltage of the first transistor M1, an initialization transistor that initializes the voltage of the first node N1 and/or the first connection electrode ELT1, an emission control transistor that controls a period in which driving current is supplied to the emission circuit EMU, and/or a boosting capacitor that boosts the voltage of the first node N1.

The emission circuit EMU may include at least one light emitting element LD, for example, light emitting elements LD, connected between the first power supply VDD and the second power supply VSS.

For example, the emission circuit EMU may include a first connection electrode ELT1 connected to the first power supply VDD by the pixel circuit PXC and the first power line PL1, a fifth connection electrode ELT5 connected to the second power supply VSS through the second power line PL2, and light emitting elements LD connected between the first and fifth connection electrodes ELT1 and ELT5.

The first power supply VDD and the second power supply VSS may have different potentials to allow the light emitting elements LD to emit light. For example, the first power supply VDD may be set as a high-potential power supply, and the second power supply VSS may be set as a low-potential power supply.

In an embodiment, the emission circuit EMU may include at least one serial stage. Each serial stage may include a pair of electrodes (for example, two electrodes), and at least one light emitting element LD connected in a forward direction between the pair of electrodes. Here, the number of serial stages that form the emission circuit EMU and the number of light emitting elements LD that form each serial stage are not particularly limited. For example, the numbers of light emitting elements LD that form the respective serial stages may be identical with or different from each other. The number of light emitting elements LD of each serial stage is not particularly limited.

For example, the emission circuit EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include a first connection electrode ELT1, a second connection electrode ELT2, and at least one first light emitting element LD1 connected between the first and second connection electrodes ELT1 and ELT2. Each first light emitting element LD1 may be connected in the forward direction between the first and second connection electrodes ELT1 and ELT2. For example, a first end EP1 of the first light emitting element LD1 may be connected to the first connection electrode ELT1. A second end EP2 of the first light emitting element LD1 may be connected to the second connection electrode ELT2.

The second serial stage may include the second connection electrode ELT2, a third connection electrode ELT3, and at least one second light emitting element LD2 connected between the second and third connection electrodes ELT2 and ELT3. Each second light emitting element LD2 may be connected in the forward direction between the second and third connection electrodes ELT2 and ELT3. For example, a first end EP1 of the second light emitting element LD2 may be connected to the second connection electrode ELT2. A second end EP2 of the second light emitting element LD2 may be connected to the third connection electrode ELT3.

The third serial stage may include the third connection electrode ELT3, a fourth connection electrode ELT4, and at least one third light emitting element LD3 connected between the third and fourth connection electrodes ELT3 and ELT4. Each third light emitting element LD3 may be connected in the forward direction between the third and fourth connection electrodes ELT3 and ELT4. For example, a first end EP1 of the third light emitting element LD3 may be connected to the third connection electrode ELT3. A second end EP2 of the third light emitting element LD3 may be connected to the fourth connection electrode ELT4.

The fourth serial stage may include the fourth connection electrode ELT4, a fifth connection electrode ELT5, and at least one fourth light emitting element LD4 connected between the fourth and fifth connection electrodes ELT4 and ELT5. Each fourth light emitting element LD4 may be connected in the forward direction between the fourth and fifth connection electrodes ELT4 and ELT5. For example, a first end EP1 of the fourth light emitting element LD4 may be connected to the fourth connection electrode ELT4. A second end EP2 of the fourth light emitting element LD4 may be connected to the fifth connection electrode ELT5.

The 1st electrode of the emission circuit EMU, for example, the first connection electrode ELT1, may be an anode electrode of the emission circuit EMU. The last electrode of the emission circuit EMU, for example, the fifth connection electrode ELT5, may be a cathode electrode of the emission circuit EMU.

The other electrodes of the emission circuit EMU, for example, the second connection electrode ELT2, the third connection electrode ELT3, and/or the fourth connection electrode ELT4, each may form an intermediate electrode. For example, the second connection electrode ELT2 may form a first intermediate electrode IET1. The third connection electrode ELT3 may form a second intermediate electrode IET2. The fourth connection electrode ELT4 may form a third intermediate electrode IET3.

In case that the light emitting elements LD are connection in a serial/parallel structure, power efficiency may be enhanced, compared to the case where a same number of light emitting elements LD are connected only in parallel to each other. Furthermore, in the sub-pixel PXL in which the light emitting elements LD are connected in the serial/parallel structure, even if a short-circuit defect or the like occurs in some serial stages, sufficient luminance can be expressed by the light emitting elements LD of the other serial stages, so that the probability of occurrence of a black spot defect in the sub-pixel PXL can be reduced. However, the disclosure is not limited thereto. The emission circuit EMU may be formed by connecting the light emitting elements LD only in series. By way of example, the emission circuit EMU may be formed by connecting the light emitting elements LD only in parallel.

Each of the light emitting elements LD may include a first end EP1 (for example, a p-type end) connected to the first power supply VDD via at least one electrode (for example, the first connection electrode ELT1), the pixel circuit PXC, and/or the first power line PL1, and a second end EP2 (for example, an n-type end) connected to the second power supply VSS via at least another electrode (for example, the fifth connection electrode ELT5), and the second power line PL2. In other words, the light emitting elements LD may be connected in the forward direction between the first power supply VDD and the second power supply VSS. The light emitting elements LD connected in the forward direction may form valid light sources of the emission circuit EMU.

The light emitting elements LD may emit, when driving current is supplied thereto through the corresponding pixel circuit PXC, light having luminance corresponding to the driving current. For example, during each frame period, the pixel circuit PXC may supply driving current corresponding to a gray scale value to be expressed in a corresponding frame to the light emitter EMU. Hence, the light emitting elements LD may emit light having luminance corresponding to the driving current, so that the emission circuit EMU may express the luminance corresponding to the driving current.

Figure 18:
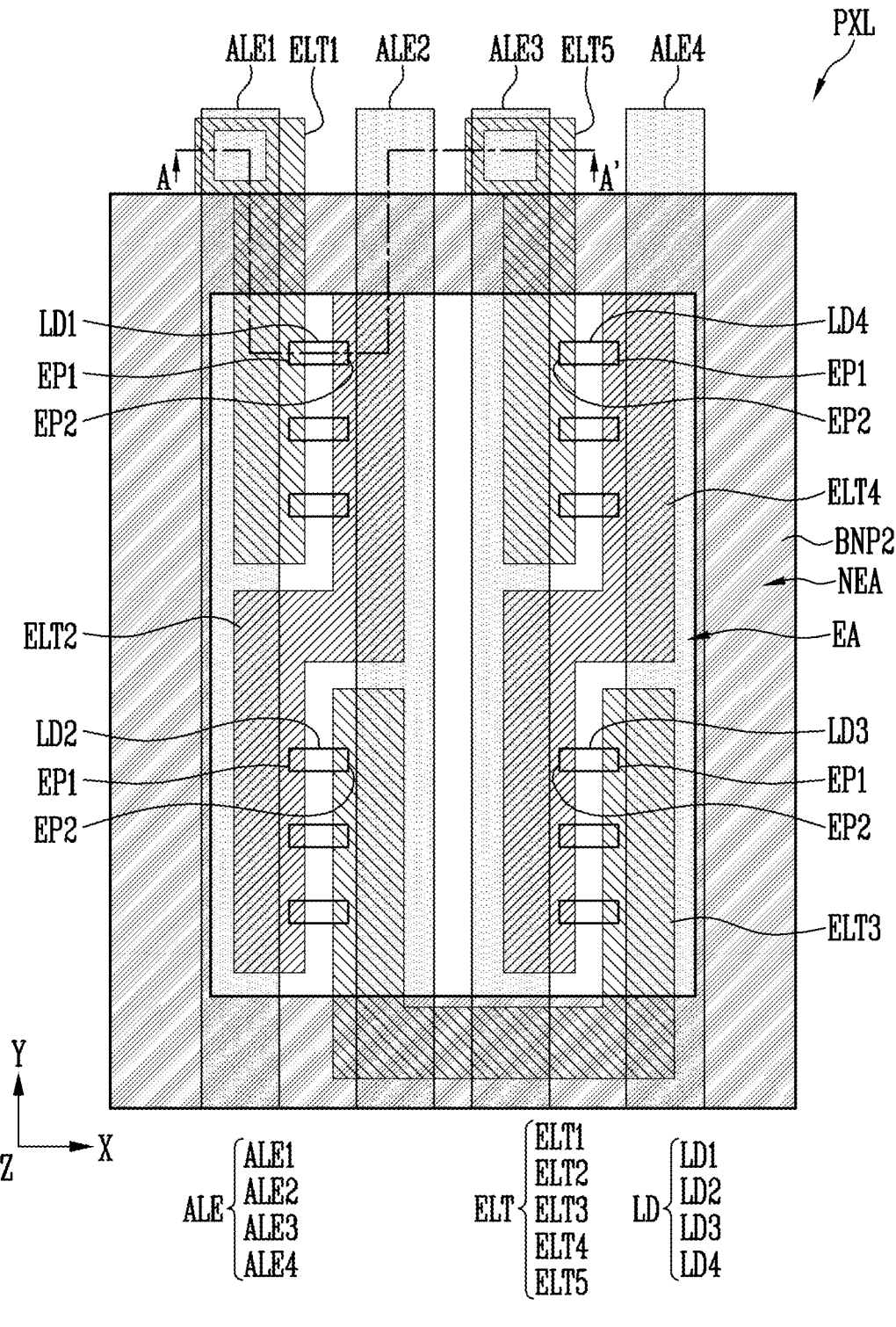
FIG. 18 is a schematic plan view illustrating a sub-pixel in accordance with an embodiment.
Figure 19:
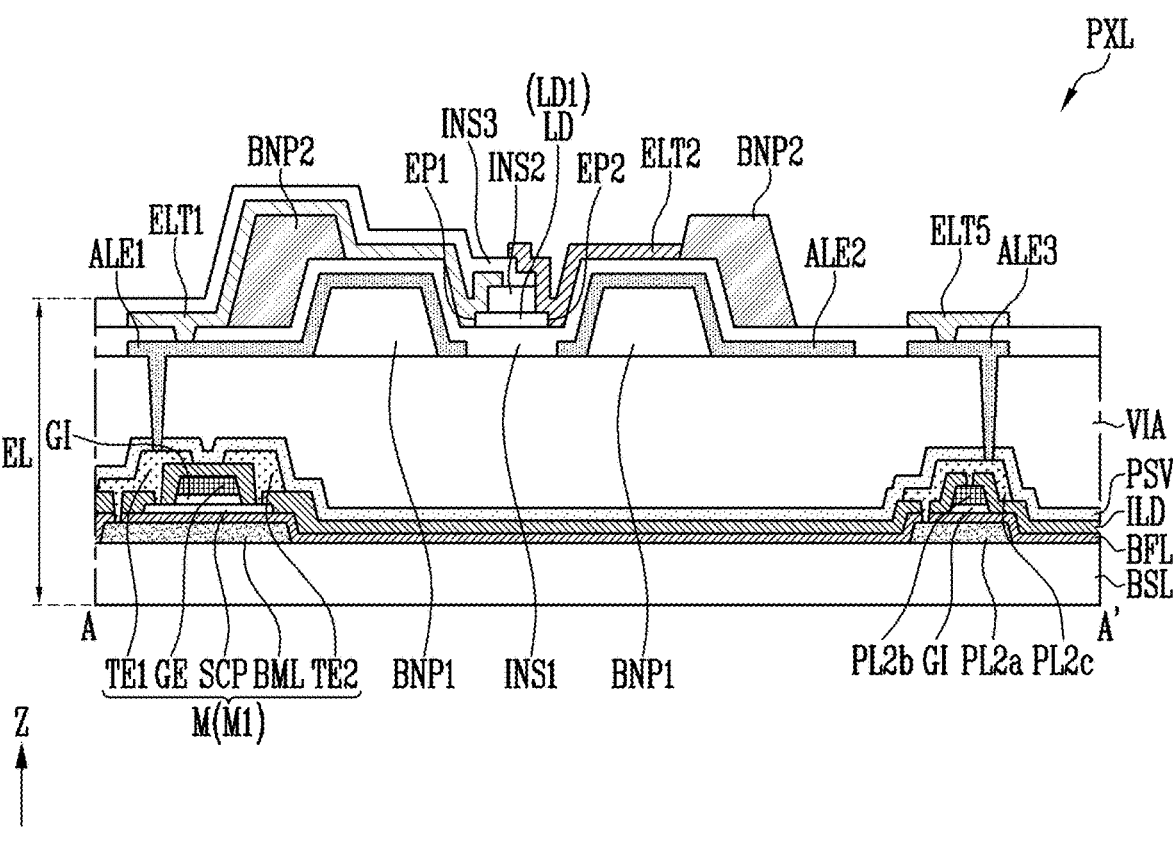
FIG. 19 is a schematic sectional view taken along line A-A' of FIG. 18.

FIG. 18 is a schematic plan view illustrating a sub-pixel in accordance with an embodiment. FIG. 19 is a schematic sectional view taken along line A-A' of FIG. 18.

For example, the sub-pixel PXL of FIG. 18 may be any one of the first to third sub-pixels PXL1, PXL2, and PXL3 that form the pixel unit PXU of FIG. 16, and the first to third sub-pixels PXL1, PXL2, and PXL3 may have substantially identical or similar structures. Although FIG. 18 illustrates an embodiment in which, as illustrated in FIG. 17, each sub-pixel PXL may include light emitting elements LD disposed in four serial stages, the number of serial stages in the sub-pixel PXL may be changed in various ways depending on embodiments.

Hereinafter, the term "light emitting element LD" or "light emitting elements LD" will be used to arbitrarily designate at least one light emitting element of the first to fourth light emitting elements LD1, LD2, LD3, and LD4, or collectively designate two or more kinds of light emitting elements. Furthermore, the term "electrode ALE" or "electrodes ALE" will be used to arbitrarily designate at least one of electrodes including the first to fourth electrodes ALE1, ALE2, ALE3, and ALE4. The term "connection electrode ELT" or "connection electrode ELT" will be used to arbitrarily designate at least one of electrodes including the first to fifth connection electrodes ELT1, ELT2, ELT3, ELT4, and ELT5.

Referring to FIG. 18, each sub-pixel PXL may include an emission area EA and a non-emission area NEA. The emission area EA may be an area which may include light emitting elements LD and is able to emit light. The non-emission area NEA may be disposed to enclose the emission area EA. The non-emission area NEA may be an area where a second bank pattern BNP2 enclosing the emission area EA is provided.

The sub-pixels PXL each may include electrodes ALE, light emitting elements LD, and/or connection electrodes ELT. The electrodes ALE may be provided in at least the emission area EA. The electrodes ALE may extend in a second direction (a Y-axis direction) and be spaced apart from each other in a first direction (an X-axis direction). The electrodes ALE may extend from the emission area EA to the non-emission area NEA. For example, the first to fourth electrodes ALE1, ALE2, ALE3, and ALE4 each may extend in the second direction (the Y-axis direction), and may be spaced apart from each other in the first direction (the X-axis direction) and successively disposed.

Some or a number of the electrodes ALE may be connected to the pixel circuit (PXC of FIG. 17) and/or a power line through a contact hole. For example, the first electrode ALE1 may be connected to the pixel circuit PXC and/or the first power line PL1 through a contact hole, and the third electrode ALE3 may be connected to the second power line PL2 through a contact hole.

In an embodiment, some or a number of the electrodes ALE may be electrically connected to some or a number of the connection electrodes ELT through a contact hole. For example, the first electrode ALE1 may be electrically connected to the first connection electrode ELT1 through a contact hole. The third electrode ALE3 may be electrically connected to the fifth connection electrode ELT5 through a contact hole.

A pair of alignment electrodes ALE adjacent to each other may be supplied with different signals at the step of aligning the light emitting elements LD. For example, in case that the first to fourth electrodes ALE1, ALE2, ALE3, and ALE4 are successively arranged in the first direction (the X-axis direction), the first and second electrodes ALE1 and ALE2 may make a pair and be supplied with different alignment signals, and the third and fourth electrodes ALE3 and ALE4 may make a pair and be supplied with different alignment signals.

In an embodiment, the second and third electrodes ALE2 and ALE3 may be supplied with an identical signal at the step of aligning the light emitting elements LD. Although FIG. 18 illustrates that the second and third electrodes ALE2 and ALE3 are separated from each other, the second and third electrodes ALE2 and ALE3 may be integrally or non-integrally connected to each other at the step of aligning the light emitting elements LD.

In an embodiment, first bank patterns (BNP1 of FIG. 19) may be disposed under or below the electrodes ALE. The first bank patterns BNP1 may be provided in at least the emission area EA. The first bank patterns BNP1 may extend in the second direction (the Y-axis direction) and be spaced apart from each other in the first direction (the X-axis direction).

Since the first bank patterns BNP1 are provided under or below respective partial areas of the electrodes ALE, the respective partial areas of the electrodes ALE may protrude in an upward direction of the sub-pixel PXL, for example, in the third direction (the Z-axis direction), in the areas where the respective first bank patterns BNP1 are formed. In case that the first bank patterns BNP1 and/or the electrodes ALE include reflective material, a reflective wall structure may be formed around the light emitting elements LD. Hence, light emitted from the light emitting elements LD may be emitted in the upward direction of the sub-pixel PXL (for example, in a frontal direction of the display panel PNL including a viewing angle range), so that the light output efficiency of the display panel PNL may be improved.

The light emitting elements LD may be aligned between a pair of electrodes ALE in each emission area EA. Furthermore, the light emitting elements LD each may be electrically connected between a pair of connection electrodes ELT.

The first light emitting element LD1 may be aligned between the first and second electrodes ALE1 and ALE2. The first light emitting element LD1 may be electrically connected between the first and second connection electrodes ELT1 and ELT2. For example, the first light emitting element LD1 may be aligned in first areas (for example, upper end areas) of the first and second electrodes ALE1 and ALE2. The first end EP1 of the first light emitting element LD1 may be electrically connected to the first connection electrode ELT1. The second end EP2 of the first light emitting element LD1 may be electrically connected to the second connection electrode ELT2.

The second light emitting element LD2 may be aligned between the first and second electrodes ALE1 and ALE2. The second light emitting element LD2 may be electrically connected between the second and third connection electrodes ELT2 and ELT3. For example, the second light emitting element LD2 may be aligned in second areas (for example, lower end areas) of the first and second electrodes ALE1 and ALE2. The first end EP1 of the second light emitting element LD2 may be electrically connected to the second connection electrode ELT2. The second end EP2 of the second light emitting element LD2 may be electrically connected to the third connection electrode ELT3.

The third light emitting element LD3 may be aligned between the third and fourth electrodes ALE3 and ALE4. The third light emitting element LD3 may be electrically connected between the third and fourth connection electrodes ELT3 and ELT4. For example, the third light emitting element LD3 may be aligned in second areas (for example, lower end areas) of the third and fourth electrodes ALE3 and ALE4. The first end EP1 of the third light emitting element LD3 may be electrically connected to the third connection electrode ELT3. The second end EP2 of the third light emitting element LD3 may be electrically connected to the fourth connection electrode ELT4.

The fourth light emitting element LD4 may be aligned between the third and fourth electrodes ALE3 and ALE4. The fourth light emitting element LD4 may be electrically connected between the fourth and fifth connection electrodes ELT4 and ELT5. For example, the fourth light emitting element LD4 may be aligned in first areas (for example, upper end areas) of the third and fourth electrodes ALE3 and ALE4. The first end EP1 of the fourth light emitting element LD4 may be electrically connected to the fourth connection electrode ELT4. The second end EP2 of the fourth light emitting element LD4 may be electrically connected to the fifth connection electrode ELT5.

For example, the first light emitting element LD1 may be disposed in a left upper end area of the emission area EA. The second light emitting element LD2 may be disposed in a left lower end area of the emission area EA. The third light emitting element LD3 may be disposed in a right lower end area of the emission area EA. The fourth light emitting element LD4 may be disposed in a right upper end area of the emission area EA. Here, the arrangement and/or connection structure of the light emitting elements LD may be changed in various ways depending on the structure of the emission circuit EMU and/or the number of serial stages.

The connection electrodes ELT each may be provided in at least the emission area EA, and be disposed to overlap at least one electrode ALE and/or light emitting element LD. For example, the connection electrodes ELT may be provided on the electrodes ALE and/or the light emitting elements LD in such a way that each of the connection electrodes ELT overlaps the corresponding electrodes ALE and/or the corresponding light emitting elements LD, whereby the connection electrodes ELT may be electrically connected to the light emitting elements LD.

The first connection electrode ELT1 may be disposed on the first area (for example, the upper end area) of the first electrode ALE1 and the first ends EP1 of the first light emitting elements LD1, and thus electrically connected to the first ends EP1 of the first light emitting elements LD1.

The second connection electrode ELT2 may be disposed on the first area (for example, the upper end area) of the second electrode ALE2 and the second ends EP2 of the first light emitting elements LD1, and thus electrically connected to the second ends EP2 of the first light emitting elements LD1. Furthermore, the second connection electrode ELT2 may be disposed on the second area (for example, the lower end area) of the first electrode ALE1 and the first ends EP1 of the second light emitting elements LD2, and thus electrically connected to the first ends EP1 of the second light emitting elements LD2. For example, the second connection electrode ELT2 may electrically connect the second ends EP2 of the first light emitting elements LD1 and the first ends EP1 of the second light emitting elements LD2 to each other in the emission area EA. To this end, the second connection electrode ELT2 may have a bent shape. For example, the third connection electrode ELT2 may have a bent or curved structure on a boundary between an area where at least one first light emitting element LD1 is disposed and an area where at least one second light emitting element LD2 is disposed.

The third connection electrode ELT3 may be disposed on the second area (for example, the lower end area) of the second electrode ALE2 and the second ends EP2 of the second light emitting elements LD2, and thus electrically connected to the second ends EP2 of the second light emitting elements LD2. Furthermore, the third connection electrode ELT3 may be disposed on the second area (for example, the lower end area) of the fourth electrode ALE4 and the first ends EP1 of the third light emitting elements LD3, and thus electrically connected to the first ends EP1 of the third light emitting elements LD3. For example, the third connection electrode ELT3 may electrically connect the second ends EP2 of the second light emitting elements LD2 and the first ends EP1 of the third light emitting elements LD3 to each other in the emission area EA. To this end, the third connection electrode ELT3 may have a bent shape. For example, the third connection electrode ELT3 may have a bent or curved structure on a boundary between an area where at least one second light emitting element LD2 is disposed and an area where at least one third light emitting element LD3 is disposed.

The fourth connection electrode ELT4 may be disposed on the second area (for example, the lower end area) of the third electrode ALE3 and the second ends EP2 of the third light emitting elements LD3, and thus electrically connected to the second ends EP2 of the third light emitting elements LD3. Furthermore, the fourth connection electrode ELT4 may be disposed on the first area (for example, the upper end area) of the fourth electrode ALE4 and the first ends EP1 of the fourth light emitting elements LD4, and thus electrically connected to the first ends EP1 of the fourth light emitting elements LD4. For example, the fourth connection electrode ELT4 may electrically connect the second ends EP2 of the third light emitting elements LD3 and the first ends EP1 of the fourth light emitting elements LD4 to each other in the emission area EA. To this end, the fourth connection electrode ELT4 may have a bent shape. For example, the fourth connection electrode ELT4 may have a bent or curved structure on a boundary between an area where at least one third light emitting element LD3 is disposed and an area where at least one fourth light emitting element LD4 is disposed.

The fifth connection electrode ELT5 may be disposed on the first area (for example, the upper end area) of the third electrode ALE3 and the second ends EP2 of the fourth light emitting elements LD4, and thus electrically connected to the second ends EP2 of the fourth light emitting elements LD4.

In this way, the light emitting elements LD aligned between the electrodes ALE may be connected in a desired form by using the connection electrodes ELT. For example, the first light emitting elements LD1, the second light emitting elements LD2, the third light emitting elements LD3, and the fourth light emitting elements LD4 may be successively connected in series by using the connection electrodes ELT.

Hereinafter, a sectional structure of each sub-pixel PXL will be described in detail based on the light emitting element LD, with reference to FIG. 19. FIG. 19 illustrates a light emitting element layer EL of the sub-pixel PXL FIG. 19 illustrates a first transistor M1 of various circuit elements that form the pixel circuit (refer to PXC of FIG. 17). In case that there is no need to separately designate the first to third transistors M1, M2, and M3, the term "transistor M" will be collectively used. The structures of the transistors M and/or positions in layers thereof are not limited to those of the embodiment shown in FIG. 19 and may be changed in various ways depending on embodiments.

Referring to FIG. 19, the light emitting element layer EL for the sub-pixels PXL in accordance with an embodiment may include circuit elements including transistors M disposed on the base layer BSL, and various lines connected to the circuit elements. The electrodes ALE, the light emitting elements LD, and/or the connection electrodes ELT that form the emission circuit EMU may be disposed on the circuit elements.

The base layer BSL may form a base and be formed of a rigid or flexible substrate or film. For example, the base layer BSL may be a rigid substrate made of glass or reinforced glass, a flexible substrate (or a thin film) formed of plastic or metal, or at least one insulating layer. The material and/or properties of the base layer BSL is not particularly limited. In an embodiment, the base layer BSL may be substantially transparent. Here, the words "substantially transparent" may mean that light can pass through the substrate SUB at a transmissivity or more. In an embodiment, the base layer BSL may be translucent or opaque. Furthermore, the base layer BSL may include reflective material in some embodiments.

The bottom conductive layer BML and a first power conductive layer PL2a may be disposed on the base layer BSL. The bottom conductive layer BML and the first power conductive layer PL2a may be disposed on a same layer. For example, the bottom conductive layer BML and the first power conductive layer PL2a may be simultaneously formed through a same process, but the disclosure is not limited thereto. The first power conductive layer PL2a may form the second power line PL2 described with reference to FIG. 17 or the like within the spirit and the scope of the disclosure.

The bottom conductive layer BML and the first power conductive layer PL2a each may have a single layer or multilayer structure formed of at least one of molybdenum (Mo), copper (Cu), aluminum (Al), chrome (Cr), gold (Au), titanium (Ti), nickel (Ni), neodymium (Nd), and indium tin oxide (ITO), or an alloy thereof.

A buffer layer BFL may be disposed on the bottom conductive layer BML and the first power conductive layer PL2a. The buffer layer BFL may prevent impurities from diffusing into a circuit element. The buffer layer BFL may be formed of a single layer, or may be formed of multiple layers having at least two or more layers. In case that the buffer layer BFL has a multilayer structure, the respective layers may be formed of a same material or a similar material or different materials.

A semiconductor pattern SCP may be disposed on the buffer layer BFL. For example, each semiconductor pattern SCP may include a first area which contacts a first transistor electrode TE1, a second area which contacts a second transistor electrode TE2, and a channel area disposed between the first and second areas. In an embodiment, one of the first and second areas may be a source area, and the other one may be a drain area.

In an embodiment, the semiconductor pattern SCP may be formed of polysilicon, amorphous silicon, an oxide semiconductor, etc., for example. The channel area of the semiconductor pattern SCP may be an intrinsic semiconductor, which is an undoped semiconductor pattern. Each of the first and second areas of the semiconductor pattern SCP may be a semiconductor doped with a dopant.

A gate insulating layer GI may be disposed on the buffer layer BFL and the semiconductor pattern SCP. For example, the gate insulating layer GI may be disposed between the semiconductor pattern SCP and the gate electrode GE. Furthermore, the gate insulating layer GI may be disposed between the buffer layer BFL and a second power conductive layer PL2b. The gate insulating layer GI may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The gate electrode GE of the transistor M and the second power conductive layer PL2b may be disposed on the gate insulating layer GI. The gate electrode GE and the second power conductive layer PL2b may be disposed on a same layer. For example, the gate electrode GE and the second power conductive layer PL2b may be simultaneously formed through a same process, but the disclosure is not limited thereto. The gate electrode GE may be disposed on the gate insulating layer GI to overlap the semiconductor pattern SCP in the third direction DR3 (the Z-axis direction). The second power conductive layer PL2b may be disposed on the gate insulating layer GI to overlap the first power conductive layer PL2a in the third direction DR3 (the Z-axis direction). The second power conductive layer PL2b along with the first power conductive layer PL2a may form the second power line PL2 described with reference to FIG. 17 or the like within the spirit and the scope of the disclosure.

The gate electrode GE and the second power conductive layer PL2b each may have a single layer or multilayer structure formed of at least one of titanium (Ti), copper (Cu), indium tin oxide (ITO), molybdenum (Mo), chrome (Cr), gold (Au), nickel (Ni), and neodymium (Nd), or an alloy thereof. For example, the gate electrode GE and the second power conductive layer PL2b each may have a multilayer structure formed by successively or repeatedly stacking titanium (Ti), copper (Cu), and/or indium tin oxide (ITO).

An interlayer insulating layer ILD may be disposed on the gate electrode GE and the second power conductive layer PL2b. For example, the interlayer insulating layer ILD may be disposed between the gate electrode GE and the first and second transistor electrodes TE1 and TE2. Furthermore, the interlayer insulating layer ILD may be disposed between the second power conductive layer PL2b and a third power conductive layer PL2c.

The interlayer insulating layer ILD may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first and second transistor electrodes TE1 and TE2 of the transistor M and the third power conductive layer PL2c may be disposed on the interlayer insulating layer ILD. The first and second transistor electrodes TE1 and TE2 and the third power conductive layer PL2c may be formed of a same layer. For example, the first and second transistor electrodes TE1 and TE2 and the third power conductive layer PL2c may be simultaneously formed through a same process, but the disclosure is not limited thereto.

The first and second transistor electrodes TE1 and TE2 may be disposed to overlap the semiconductor pattern SCP in the third direction DR3 (the Z-axis direction). The first and second transistor electrodes TE1 and TE2 may be electrically connected to the semiconductor pattern SCP. For example, the first transistor electrode TE1 may be electrically connected with the first area of the semiconductor pattern SCP through a contact hole passing through the interlayer insulating layer ILD. Furthermore, the first transistor electrode TE1 may be electrically connected with the bottom conductive layer BML through a contact hole passing through the interlayer insulating layer ILD and the buffer layer BFL. The second transistor electrode TE2 may be electrically connected with the second area of the semiconductor pattern SCP through a contact hole passing through the interlayer insulating layer ILD. In an embodiment, any one of the first and second transistor electrodes TE1 and TE2 may be a source electrode, and the other one may be a drain electrode.

The third power conductive layer PL2c may be disposed to overlap the first power conductive layer PL2a and/or the second power conductive layer PL2b in the third direction (the Z-axis direction). The third power conductive layer PL2c may be electrically connected to the first power conductive layer PL2a and/or the second power conductive layer PL2b. For example, the third power conductive layer PL2c may be electrically connected to the first power conductive layer PL2a through a contact hole passing through the interlayer insulating layer ILD and the buffer layer BFL. Furthermore, the third power conductive layer PL2c may be electrically connected to the second power conductive layer PL2b through a contact hole passing through the interlayer insulating layer ILD. The third power conductive layer PL2c along with the first power conductive layer PL2a and/or the second power conductive layer PL2b may form the second power line PL2 described with reference to FIG. 17 or the like within the spirit and the scope of the disclosure.

The first and second transistor electrodes TE1 and TE2 and the third power conductive layer PL2c each may have a single layer or multilayer structure formed of at least one of aluminum (Al), molybdenum (Mo), chrome (Cr), gold (Au), titanium (Ti), nickel (Ni), neodymium (Nd), and indium tin oxide ITO, or alloy thereof.

A passivation layer PSV may be disposed on the first and second transistor electrodes TE1 and TE2 and the third power conductive layer PL2c. The passivation layer PSV may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A via layer VIA may be disposed on the passivation layer PSV. The via layer VIA may be formed of organic material for planarizing a stepped structure provided therebelow. For example, the via layer VIA may include organic material such as acrylates resin, epoxy resin, phenolic resin, polyamides resin, polyimides resin, polyesters resin, polyphenylenesulfides resin, or benzocyclobutene (BCB). However, the disclosure is not limited thereto. The via layer VIA may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The first bank patterns BNP1 may be disposed on the via layer VIA. The first bank pattern BNP1 may have various shapes depending on embodiments. In an embodiment, the first bank patterns BNP1 may have a shape protruding from the base layer BSL in the third direction (the Z-axis direction). Furthermore, the first bank patterns BNP1 may have an inclined surface angled to the base layer BSL at an angle. However, the disclosure is not limited thereto. The first bank patterns BNP1 may have a sidewall having a curved or stepped shape. For example, the first bank patterns BNP1 may have a semi-circular or semi-elliptical cross-section.

The electrodes and the insulating layers that are disposed over the first bank patterns BNP1 may have shapes corresponding to that of the first bank patterns BNP1. For example, the electrodes ALE that are disposed on the first bank patterns BNP1 may include inclined surfaces or curved surfaces having shapes corresponding to that of the first bank patterns BNP1. Hence, the first bank patterns BNP1 along with the electrodes ALE provided thereon may function as reflectors for guiding light emitted from the light emitting elements LD in the frontal direction of the sub-pixel PXL, for example, in the third direction DR3 (the Z-axis direction), and thus enhancing the light output efficiency of the display panel PNL.

The first bank patterns BNP1 may include at least one organic material and/or inorganic material. For example, the first bank patterns BNP1 may include organic material such as acrylates resin, epoxy resin, phenolic resin, polyamides resin, polyimides resin, polyesters resin, polyphenylenesulfides resin, or benzocyclobutene (BCB). However, the disclosure is not limited thereto. The first bank patterns BNP1 may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The electrodes ALE may be disposed on the via layer VIA and the first bank patterns BNP1. The electrodes ALE may be disposed at positions spaced apart from each other in the sub-pixel PXL. The electrodes ALE may be disposed on a same layer. For example, the electrodes ALE may be simultaneously formed through a same process, but the disclosure is not limited thereto.

The electrodes ALE may be supplied with alignment signals at the step of aligning the light emitting elements LD. Therefore, an electric field may be formed between the electrodes ALE, so that the light emitting elements LD that are provided in each of the sub-pixels PXL may be aligned between the electrodes ALE.

The electrode ALE may include at least one conductive material. For example, the electrodes ALE may include at least one material among at least one metal of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, conductive oxide such as indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and a conductive polymer such as PEDOT, but the disclosure is not limited thereto.

The first electrode ALE1 may be electrically connected to the first transistor electrode TE1 of the transistor M through a contact hole passing through the via layer VIA and the passivation layer PSV. The third electrode ALE3 may be electrically connected to the third power conductive layer PL2c through a contact hole passing through the via layer VIA and the passivation layer PSV.

A first insulating layer INS1 may be disposed on the electrodes ALE. The first insulating layer INS1 may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The second bank patterns BNP2 may be disposed on the first insulating layer INS1. The second bank patterns BNP2 each may form, at the step of supplying the light emitting elements LD to each sub-pixel PXL, a dam structure for defining an emission area to which the light emitting elements LD are to be supplied. For example, a desired kind and/or amount of light emitting element ink may be supplied to the area defined by the second bank patterns BNP2.

The second bank patterns BNP2 may include organic material such as acrylates resin, epoxy resin, phenolic resin, polyamides resin, polyimides resin, polyesters resin, polyphenylenesulfides resin, or benzocyclobutene (BCB). However, the disclosure is not limited thereto. The second bank patterns BNP2 may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In an embodiment, the second bank patterns BNP2 may include at least one light shielding and/or reflective material. Therefore, a light leakage between adjacent pixels PXL may be prevented from being caused. For example, the second bank patterns BNP2 may include at least one black matrix material and/or color filter material. For instance, the second bank patterns BNP2 may be formed of a black opaque pattern which can block transmission of light. In an embodiment, a reflective layer (not illustrated) or the like may be formed on a surface (for example, a sidewall) of the second ban patterns BNP2 to increase the light efficiency of each sub-pixel PXL.

The light emitting elements LD may be disposed on the first insulating layer INS1. The light emitting elements LD may be disposed on the first insulating layer INS1 between the electrodes ALE. The light emitting elements LD may be prepared in a diffused form in the light emitting element ink, and supplied to each of the sub-pixels PXL by an inkjet printing scheme or the like within the spirit and the scope of the disclosure. For example, the light emitting elements LD may be diffused in a volatile solvent and supplied to each of the sub-pixels PXL. Thereafter, if alignment signals are supplied to the electrodes ALE, an electric field may be formed between the electrodes ALE so that the light emitting elements LD may be aligned between the electrodes ALE. After the light emitting elements LD have been aligned, the solvent may be removed by a volatilization scheme or other schemes. In this way, the light emitting elements LD may be reliably arranged between the electrodes ALE.

A second insulating layer INS2 may be disposed on the light emitting elements LD. For example, the second insulating layer INS2 may be partially provided on the light emitting elements LD so that the first and second ends EP1 and EP2 of the light emitting elements LD are exposed from the second insulating layer INS2. In case that the second insulating layer INS2 is formed on the light emitting elements LD after the alignment of the light emitting elements LD has been completed, the light emitting elements LD may be prevented from being removed from the aligned positions.

The second insulating layer INS2 may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The connection electrodes ELT may be disposed on the first and second ends EP1 and EP2 of the light emitting elements LD that are exposed from the second insulating layer INS2. The first connection electrode ELT1 may be disposed on or directly disposed on the first ends EP1 of the first light emitting elements LD1 and contact the first ends EP1 of the first light emitting elements LD1.

Furthermore, the second connection electrode ELT2 may be disposed on or directly disposed on the second ends EP2 of the first light emitting elements LD1 and contact the second ends EP2 of the first light emitting elements LD1. Furthermore, the second connection electrode ELT2 may be disposed on or directly disposed on the first ends EP1 of the second light emitting elements LD2 and contact the first ends EP1 of the second light emitting elements LD2. In other words, the second connection electrode ELT2 may electrically connect the second ends EP2 of the first light emitting elements LD1 with the first ends EP1 of the second light emitting elements LD2.

Likewise, the third connection electrode ELT3 may be disposed on or directly disposed on the second ends EP2 of the second light emitting elements LD2 and contact the second ends EP2 of the second light emitting elements LD2. Furthermore, the third connection electrode ELT3 may be disposed on or directly disposed on the first ends EP1 of the third light emitting elements LD3 and contact the first ends EP1 of the third light emitting elements LD3. In other words, the third connection electrode ELT3 may electrically connect the second ends EP2 of the second light emitting elements LD2 with the first ends EP1 of the third light emitting elements LD3.

Likewise, the fourth connection electrode ELT4 may be disposed on or directly disposed on the second ends EP2 of the third light emitting elements LD3 and contact the second ends EP2 of the third light emitting elements LD3. Furthermore, the fourth connection electrode ELT4 may be disposed on or directly disposed on the first ends EP1 of the fourth light emitting elements LD4 and contact the first ends EP1 of the fourth light emitting elements LD4. In other words, the fourth connection electrode ELT4 may electrically connect the second ends EP2 of the third light emitting elements LD3 with the first ends EP1 of the fourth light emitting elements LD4.

Likewise, the fifth connection electrode ELT5 may be disposed on or directly disposed on the second ends EP2 of the fourth light emitting elements LD4 and contact the second ends EP2 of the fourth light emitting elements LD4.

In an embodiment, some or a number of the connection electrodes ELT may be disposed on a same layer. For example, the first connection electrode ELT1, the third connection electrode ELT3, and the fifth connection electrode ELT5 may be disposed on a same layer. Furthermore, the second connection electrode ELT2 and the fourth connection electrode ELT4 may be disposed on a same layer. For instance, the first connection electrode ELT1, the third connection electrode ELT3, and the fifth connection electrode ELT5 may be disposed on the second insulating layer INS2. A third insulating layer INS3 may be disposed on the first connection electrode ELT1, the third connection electrode ELT3, and the fifth connection electrode ELT5. The second connection electrode ELT2 and the fourth connection electrode ELT4 may be disposed on the third insulating layer INS3.

The third insulating layer INS3 may allow the second ends EP2 of the light emitting elements LD to be exposed. The connection electrodes ELT may be formed on the second ends EP2 of the light emitting elements LD that are exposed from the third insulating layer INS3.

As such, in case that the third insulating layer INS3 is disposed between the connection electrodes ELT that are formed of different conductive layers, the connection electrodes ELT may be reliably separated from each other by the third insulating layer INS3, so that electrical stability between the first and second ends EP1 and EP2 of the light emitting elements LD can be secured.

The connection electrodes ELT may be formed of various transparent conductive materials. For example, the connection electrodes ELT may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be substantially transparent or translucent to provide satisfactory transmittance. Hence, light emitted from the first and second ends EP1 and EP2 of the light emitting elements LD may pass through the connection electrodes ELT and be emitted outside the display panel PNL.

The third insulating layer INS3 may be formed of a single layer or multiple layers, and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Figure 20:
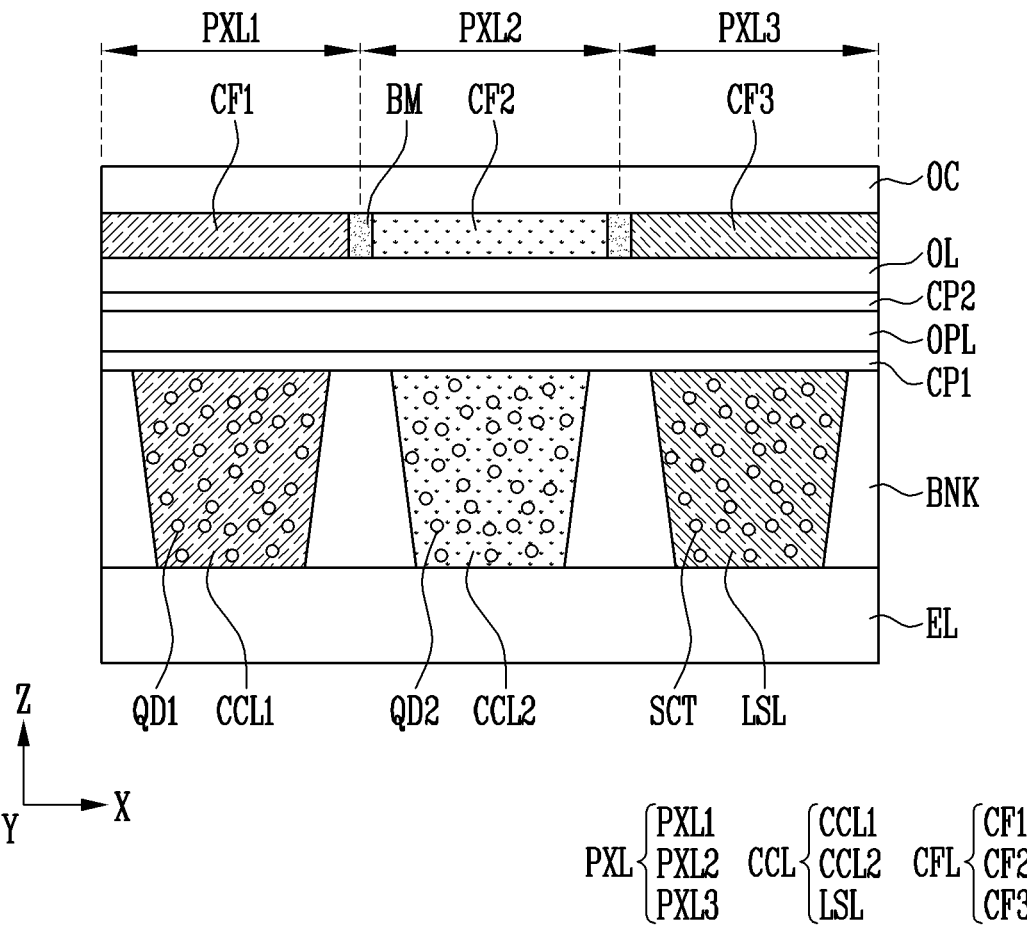
FIGS. 20 and 21 are schematic sectional views illustrating first to third sub-pixels in accordance with an embodiment.
Figure 21:
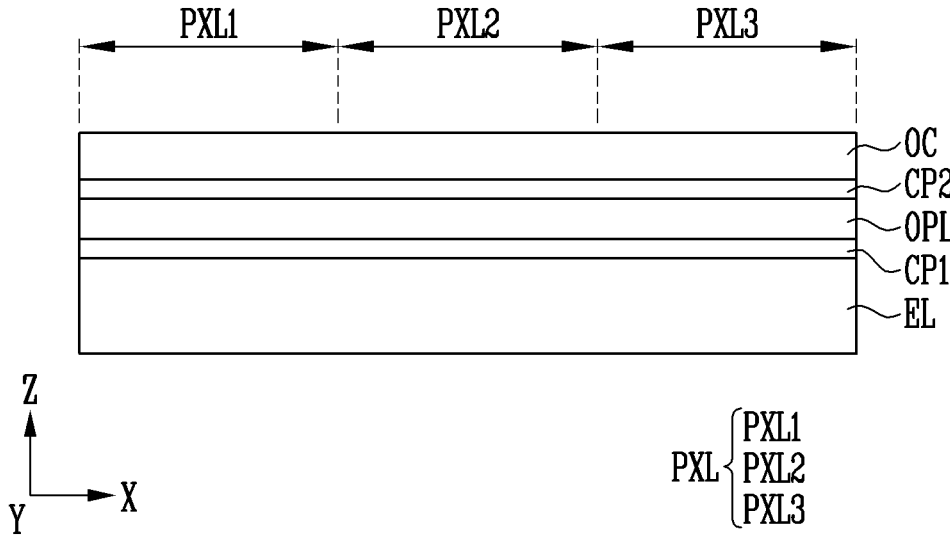

FIGS. 20 and 21 are schematic sectional views illustrating first to third sub-pixels in accordance with an embodiment.

FIG. 20 illustrates a bank BNK, a color conversion layer CCL, and/or a color filter layer CFL which are provided on the light emitting element layer EL of the sub-pixel PXL described with reference to FIGS. 18 and 19.

Referring to FIG. 20, the bank BNK may be disposed on the light emitting element layer EL for the first to third sub-pixels PXL1, PXL2, and PXL3. For example, the bank BNK may be disposed between the first to third sub-pixels PXL1, PXL2, and PXL3, and include openings which respectively overlap the first to third sub-pixels PXL1, PXL2, and PXL3. The openings of the bank BNK may provide space in which the color conversion layer CCL can be provided.

The bank BNK may include organic material such as acrylates resin, epoxy resin, phenolic resin, polyamides resin, polyimides resin, polyesters resin, polyphenylenesulfides resin, or benzocyclobutene (BCB). However, the disclosure is not limited thereto. The bank BNK may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

In an embodiment, the bank BNK may include at least one light shielding and/or reflective material. Therefore, a light leakage between adjacent sub-pixels PXL may be prevented from being caused. For example, the bank BNK may include at least one black matrix material and/or color filter material. For instance, the bank BNK may be formed of a black opaque pattern which can block transmission of light. In an embodiment, a reflective layer (not illustrated) or the like may be formed on a surface (for example, a sidewall) of the bank BNK to increase the light efficiency of each sub-pixel PXL.

The color conversion layer CCL may be disposed on the light emitting element layer EL including the light emitting elements LD in the openings of the bank BNK. The color conversion layer CCL may include a first color conversion layer CCL1 disposed in the first sub-pixel PXL1, a second color conversion layer CCL2 disposed in the second sub-pixel PXL2, and a light scattering layer LSL disposed in the third sub-pixel PXL3.

In an embodiment, the first, second, and third sub-pixels PXL1, PXL2, and PXL3 may include light emitting elements LD that emit a same color of light. For example, the first to third sub-pixels PXL1, PXL2, and PXL3 may include light emitting elements LD that emit the third color of light (or blue light). Since the color conversion layer CCL including color conversion particles is disposed in each of the first to third sub-pixels PXL1, PXL2, and PXL3, a full-color image may be displayed.

The first color conversion layer CCL1 may include first color conversion particles for converting the third color of light emitted from the light emitting element LD to the first color of light. For example, the first color conversion layer CCL1 may include first quantum dots QD1 which are dispersed in a matrix material such as base resin.

In an embodiment, in case that the light emitting element LD is a blue light emitting element that emits blue light and the first sub-pixel PXL1 is a red pixel, the first color conversion layer CCL1 may include the first quantum dots QD1 which convert blue light emitted from the blue light emitting element to red light. The first quantum dots QD1 may absorb blue light, shift the wavelength thereof according to an energy transition, and thus emit red light. In case that the first sub-pixel PXL1 is one of pixels having other colors, the first color conversion layer CCL1 may include the first quantum dots QD1 corresponding to the color of the first sub-pixel PXL1.

The second color conversion layer CCL2 may include second color conversion particles for converting the third color of light emitted from the light emitting element LD to the second color of light. For example, the second color conversion layer CCL2 may include second quantum dots QD2 which are dispersed in a matrix material such as base resin.

In an embodiment, in case that the light emitting element LD is a blue light emitting element that emits blue light and the second sub-pixel PXL2 is a green pixel, the second color conversion layer CCL2 may include the second quantum dots QD2 which convert blue light emitted from the blue light emitting element to green light. The second quantum dots QD2 may absorb blue light, shift the wavelength thereof according to an energy transition, and thus emit green light. In case that the second sub-pixel PXL2 is one of pixels having other colors, the second color conversion layer CCL2 may include the second quantum dots QD2 corresponding to the color of the second sub-pixel PXL2.

In an embodiment, as blue light having a relatively short wavelength in a visible ray area is incident on each of the first quantum dots QD1 and the second quantum dots QD2, absorption coefficients of the first quantum dot QD1 and the second quantum dot QD2 may be increased. Therefore, eventually, the efficiency of light emitted from the first sub-pixel PXL1 and the second sub-pixel PXL2 may be enhanced, and satisfactory color reproducibility may be secured. Furthermore, since the emission circuit EMU for the first to third sub-pixels PXL1, PXL2, and PXL3 is formed of light emitting elements LD (for example, blue light emitting elements) that emits a same color of light, the efficiency of fabricating the display device may be enhanced.

The light scattering layer LSL may be provided to efficiently use the third color of light (or blue light) emitted from the light emitting element LD. For example, in case that the light emitting element LD is a blue light emitting element that emits blue light and the third sub-pixel PXL3 is a blue pixel, the light scattering layer LSL may include at least one type of light scatter SCT to efficiently use light emitted from the light emitting element LD.

For example, the light scattering layer LSL may include light scatters SCT which are dispersed in a matrix material such as base resin. For instance, the light scattering layer LSL may include a light scatter SCT formed of material such as silica, but the constituent material of the light scatter SCT is not limited thereto. The light scatters SCT may not only be provided in the third sub-pixel PXL3, but may also be selectively included in the first conversion layer CCL1 or the second color conversion layer CCL2. In an embodiment, the light scatters SCT may be omitted, and the light scattering layer LSL may be formed of transparent polymer.

A first capping layer CP1 may be disposed on the color conversion layer CCL. The first capping layer CP1 may be provided over the first to third sub-pixels PXL1, PXL2, and PXL3. The first capping layer CP1 may cover or overlap the color conversion layer CCL. The first capping layer CP1 may prevent the color conversion layer CCL from being damaged or contaminated by permeation of external impurities such as water or air.

The first capping layer CP1 may be an inorganic layer, and be formed of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), or silicon oxynitride ($SiO_xN_y$).

An optical layer OPL may be disposed on the first capping layer CP1. The optical layer OPL may be provided over the first to third sub-pixels PXL1, PXL2, and PXL3.

The optical layer OPL may function to recycle light provided from the color conversion layer CCL by total reflection and thus enhance light extraction efficiency. Hence, the optical layer OPL may have a relatively low refractive index compared to that of the color conversion layer CCL. For example, the refractive index of the color conversion layer CCL may range from approximately 1.6 to approximately 2.0, and the refractive index of the optical layer OPL may range from approximately 1.1 to approximately 1.3, but the disclosure is not limited thereto.

In an embodiment, the optical layer OPL may include base resin and hollow particles dispersed in the base resin. The hollow particles may be hollow silica particles. By way of example, the hollow particles may have a pore formed by porogen, but the disclosure is not limited thereto. Furthermore, the optical layer OPL may include at least one of a titanium dioxide ($TiO_2$) particle and a nano-silicate particle, but the disclosure is not limited thereto.

A second capping layer CP2 may be disposed on the optical layer OPL. The second capping layer CP2 may be provided over the first to third sub-pixels PXL1, PXL2, and PXL3. The second capping layer CP2 may cover or overlap the optical layer OPL. The second capping layer CP2 may prevent the optical layer OPL from being damaged or contaminated by permeation of external impurities such as water or air.

The second capping layer CP2 may be an inorganic layer, and be formed of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), or silicon oxynitride ($SiO_xN_y$).

A planarization layer OL may be disposed on the second capping layer CP2. The planarization layer OL may be provided over the first to third sub-pixels PXL1, PXL2, and PXL3.

The planarization layer OL may include organic material such as acrylates resin, epoxy resin, phenolic resin, polyamides resin, polyimides resin, polyesters resin, polyphenylenesulfides resin, or benzocyclobutene (BCB). However, the disclosure is not limited thereto. The planarization layer PL may include various inorganic materials including silicon oxide ($SiO_x$), silicon nitride ($SiN_x$), silicon oxynitride (Si- $O_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The color filter layer CFL may be disposed on the planarization layer OL. The color filter layer CFL may include color filters CF1, CF2, and CF3 corresponding to the colors of the respective sub-pixels PXL. Since the color filters CF1, CF2, and CF3 corresponding to the respective colors of the first to third sub-pixels PXL1, PXL2, and PXL3 are disposed, a full-color image may be displayed.

The color filter layer CFL may include a first color filter CF1 disposed in the first sub-pixel PXL1 and to allow light emitted from the first sub-pixel PXL1 to selectively pass therethrough, a second color filter CF2 disposed in the second sub-pixel PXL2 and to allow light emitted from the second sub-pixel PXL2 to selectively pass therethrough, and a third color filter CF3 disposed in the third sub-pixel PXL3 and to allow light emitted from the third sub-pixel PXL3 to selectively pass therethrough.

In an embodiment, the first color filter CF1, the second color filter CF2, and the third color filter CF3 may be respectively a red color filter, a green color filter, and a blue color filter, but the disclosure is not limited thereto. Hereinafter, the term "color filter CF" or "color filters CF" will be used to designate any color filter of the first color filter CF1, the second color filter CF2, and the third color filter CF3, or collectively designate two or more kinds of color filters.

The first color filter CF1 may overlap the light emitting element layer EL (or the light emitting elements LD) of the first sub-pixel PXL1 and the first color conversion layer CCL1 in the third direction (the Z-axis direction). The first color filter CF1 may include color filter material for allowing the first color of light (or red light) to selectively pass therethrough. For example, in case that the first sub-pixel PXL1 is a red pixel, the first color filter CF1 may include red color filter material.

The second color filter CF2 may overlap the light emitting element layer EL (or the light emitting elements LD) of the second sub-pixel PXL2 and the second color conversion layer CCL2 in the third direction (the Z-axis direction). The second color filter CF2 may include color filter material for allowing the second color of light (or green light) to selectively pass therethrough. For example, in case that the second sub-pixel PXL2 is a green pixel, the second color filter CF2 may include green color filter material.

The third color filter CF3 may overlap the light emitting element layer EL (or the light emitting elements LD) of the third sub-pixel PXL3 and the light scattering layer LSL in the third direction (the Z-axis direction). The third color filter CF3 may include color filter material for allowing the third color of light (or blue light) to selectively pass therethrough. For example, in case that the third sub-pixel PXL3 is a blue pixel, the third color filter CF3 may include blue color filter material.

A light shielding layer BM may be further disposed between the first to third color filters CF1, CF2, and CF3. In case that the light shielding layer BM is formed between the first to third color filters CF1, CF2, and CF3, a color mixing defect which is visible from a front surface or side surface of the display device may be prevented from occurring. The material of the light shielding layer BM is not particularly limited, and various light shielding materials may be used to form the light shielding layer BM. For example, the light shielding layer BM may be embodied by stacking the first to third color filters CF1, CF2, and CF3 one each other.

An overcoat layer OC may be disposed on the color filter layer CFL. The overcoat layer OC may be provided over the first to third sub-pixels PXL1, PXL2, and PXL3. The overcoat layer OC may cover or overlap a lower component including the color filter layer CFL. The overcoat layer OC may prevent water or air from permeating the lower component. Furthermore, the overcoat layer OC may protect the lower component from foreign material such as dust.

The overcoat layer OC may include organic material such as acrylates resin, epoxy resin, phenolic resin, polyamides resin, polyimides resin, polyesters resin, polyphenylene sulfides resin, or benzocyclobutene (BCB). However, the disclosure is not limited thereto. The overcoat layer OC may include various inorganic materials including silicon oxide $(SiO_x)$, silicon nitride $(SiN_x)$, silicon oxynitride $(SiO_xN_y)$, aluminum nitride $(AlN_x)$, aluminum oxide $(AlO_x)$, zirconium oxide $(ZrO_x)$, hafnium oxide $(HfO_x)$, and titanium oxide $(TiO_x)$.

As described above, in case that a high-efficiency first color (red) and/or second color (green) light emitting element LD can be facilitated by relieving strain due to a difference in lattice constant between indium (In) and gallium (Ga), the first sub-pixel PXL1, the second sub-pixel PXL2, and the third sub-pixel PXL3 may respectively include a first color light emitting element, a second color light emitting element, and a third color light emitting element, as a light source, and thus respectively emit first, second, and third colors of light. As illustrated in FIG. 21, the color conversion layer (CCL of FIG. 20) and/or the color filter layer (CFL of FIG. 20) may be omitted, so that the process of fabricating the display device can be facilitated, and the production cost can be reduced.

For example, in case that the color conversion layer CCL is omitted, the optical layer OPL may be disposed on the light emitting element layer EL. The first capping layer CP1 may be further disposed between the light emitting element layer EL and the optical layer OPL. The overcoat layer OC may be disposed on the optical layer OPL. The second capping layer CP2 may be disposed between the optical layer OPL and the overcoat layer OC.

Since the first capping layer CP1, the optical layer OPL, the second capping layer CP2, and/or the overcoat layer OC have been in detail with reference to FIG. 20, redundant explanation thereof will be omitted.

In an embodiment of the disclosure, an active layer and/or a second semiconductor layer may be formed in a nano-pattern of an insulating film, so that strain due to a difference in lattice constant between indium (In) and gallium (Ga) can be relieved. Consequently, a high-efficiency light emitting element may be fabricated.

Furthermore, during a process of fabricating the light emitting element, an etching operation may be performed while the active layer is protected by the insulating film, so that a sidewall of the active layer can be prevented from being damaged, whereby efficiency and reliability of the light emitting element may be enhanced.

The effects of the disclosure are not limited by the foregoing, and other various effects are anticipated herein.

It will be understood by those skilled in the art that various changes in form and details may be made therein without departing from the spirit and scope of the disclosure as defined by the appended claims. Therefore, the foregoing embodiments should be considered in descriptive sense only and not for purposes of limitation. The scope of the disclosure is defined not only by the detailed description of the disclosure but also by the appended claims, and all differences within the scope will be construed as being included in the disclosure.

What is claimed is:

1. A light emitting element comprising:
   a first semiconductor layer;
   a first insulating film disposed on the first semiconductor layer, the first insulating film including a nano-pattern;
   an active layer disposed in the nano-pattern of the first insulating film;
   a second semiconductor layer disposed on the active layer in the nano-pattern of the first insulating film; and
   an electrode layer disposed on the second semiconductor layer, and covering an entirety of an exposed surface of the second semiconductor layer and an entirety of an exposed side of the first insulating film adjacent to the exposed surface of the second semiconductor layer.

2. A light emitting element comprising:
   a first semiconductor layer;
   a first insulating film disposed on the first semiconductor layer, the first insulating film including a nano-pattern;
   an active layer disposed in the nano-pattern of the first insulating film; and
   a second semiconductor layer disposed on the active layer in the nano-pattern of the first insulating film,
   wherein a diameter of the nano-pattern of the first insulating film is less than a diameter of the first semiconductor layer.

3. The light emitting element according to claim 1, wherein the nano-pattern of the first insulating film exposes the first semiconductor layer.

4. The light emitting element according to claim 1, wherein the first insulating film covers the active layer and the second semiconductor layer.

5. The light emitting element according to claim 1, wherein the active layer is disposed between the first semiconductor layer and the second semiconductor layer.

6. The light emitting element according to claim 1, further comprising:
   a second insulating film disposed on the first insulating film.

7. The light emitting element according to claim 6, wherein the second insulating film covers the first semiconductor layer that is exposed from the first insulating film.

8. The light emitting element according to claim 1, wherein the active layer emits red light.

9. The light emitting element according to claim 1, further comprising:
   a superlattice layer disposed in the nano-pattern of the first insulating film.

10. A method of fabricating a light emitting element, comprising:
    forming a first semiconductor layer on a stack substrate;
    forming a first insulating film on the first semiconductor layer;
    forming nano-patterns by etching the first insulating film;
    forming an active layer and a second semiconductor layer in the nano-patterns of the first insulating film;
    forming an electrode layer on a surface of the second semiconductor layer to cover an entirety of the surface of the second semiconductor layer and a side of the first insulating film adjacent to the surface of the second semiconductor layer; and
    partially etching the electrode layer, the first insulating film, and the first semiconductor layer so that the electrode layer covers an entirety of the surface of the second semiconductor layer and an entirety of a remaining portion of the side of the first insulating film adjacent to the surface of the second semiconductor layer after the etching, and forming light emitting patterns.

11. The method according to claim 10, wherein, in the partially etching of the first insulating film and the first semiconductor layer, the active layer and the second semiconductor layer are protected by the first insulating film.

12. The method according to claim 10, wherein the nano-patterns of the first insulating film pass through the first insulating film and expose a top surface of the first semiconductor layer.

13. The method according to claim 10, further comprising:

forming a mask on the electrode layer.

14. The method according to claim 13, wherein the mask overlaps the nano-patterns of the first insulating film in a plan view.

15. The method according to claim 14, wherein the forming of the light emitting patterns comprises etching the electrode layer, the first insulating film, and the first semiconductor layer that are exposed from the mask.

16. The method according to claim 10, further comprising:

forming a second insulating film on the light emitting patterns.

17. The method according to claim 16, wherein the second insulating film covers the first insulating film and the first semiconductor layer.

18. The method according to claim 10, further comprising:

separating the light emitting patterns from the stack substrate.

* * * * *